(12) United States Patent
Taguchi et al.

(10) Patent No.: US 6,384,671 B1
(45) Date of Patent: May 7, 2002

(54) ELECTRONIC CIRCUIT APPARATUS FOR TRANSMITTING SIGNALS THROUGH A BUS AND SEMICONDUCTOR DEVICE FOR GENERATING A PREDETERMINED STABLE VOLTAGE

(75) Inventors: Masao Taguchi; Satoshi Eto; Yoshinori Okajima, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/541,699

(22) Filed: Apr. 3, 2000

Related U.S. Application Data

(60) Continuation of application No. 09/108,233, filed on Jul. 1, 1998, now abandoned, which is a division of application No. 08/445,099, filed on May 19, 1995, now Pat. No. 5,955,889.

(30) Foreign Application Priority Data

May 20, 1994 (JP) .............................. 6-106982
Dec. 2, 1994 (JP) .............................. 6-299725

(51) Int. Cl.[7] .................................... G05F 1/10
(52) U.S. Cl. ....................................... 327/541; 323/313
(58) Field of Search .................................. 327/541, 543; 323/313

(56) References Cited

U.S. PATENT DOCUMENTS

| | | | |
|---|---|---|---|
| 3,694,665 A | 9/1972 | Belluche | 307/208 |
| 3,832,575 A | 8/1974 | Dasgupta et al. | 307/208 |
| 4,477,737 A | 10/1984 | Ulmer et al. | 327/541 |
| 4,649,291 A | 3/1987 | Konishi | 327/541 |
| 4,663,584 A | 5/1987 | Okada et al. | 323/313 |
| 4,812,735 A | 3/1989 | Sawada et al. | 323/313 |
| 4,833,342 A | 5/1989 | Kiryu et al. | 327/541 |
| 4,847,518 A | 7/1989 | Leidich | 327/541 |
| 4,987,318 A | 1/1991 | Burke et al. | 307/443 |
| 5,187,685 A | 2/1993 | Sato et al. | 365/189.09 |
| 5,260,646 A | 11/1993 | Ong | 323/349 |
| 5,264,743 A | * 11/1993 | Nakagome et al. | 327/541 |
| 5,355,033 A | 10/1994 | Jang | 326/83 |
| 5,374,861 A | 12/1994 | Kubista | 326/30 |
| 5,438,281 A | 8/1995 | Takahashi et al. | 326/86 |
| 5,534,817 A | 7/1996 | Suzuki et al. | 327/545 |
| 5,568,063 A | 10/1996 | Takekuma et al. | 326/30 |
| 5,578,940 A | 11/1996 | Dillon et al. | 326/30 |

OTHER PUBLICATIONS

Sedra et al, "Microelectronic Circuits" 1982, CBS College Publishing, pp. 302–303.*

* cited by examiner

*Primary Examiner*—Terry D. Cunningham
(74) *Attorney, Agent, or Firm*—Armstrong, Westerman & Hattori, LLP

(57) ABSTRACT

An electronic circuit apparatus having a bus, a plurality of stubs branched from the bus, and a plurality of semiconductor devices having signal input/output terminals connected to the corresponding stubs. The electronic circuit apparatus includes at least one impedance circuit arranged between the bus and at least one of the stubs, and each impedance circuit has a high-pass filter characteristic. Therefore, ringing is suppressed, attenuation in the high-frequency components of a transmission signal is prevented, the definition of the signal is maintained, and transmission frequency and speed are both improved.

4 Claims, 36 Drawing Sheets

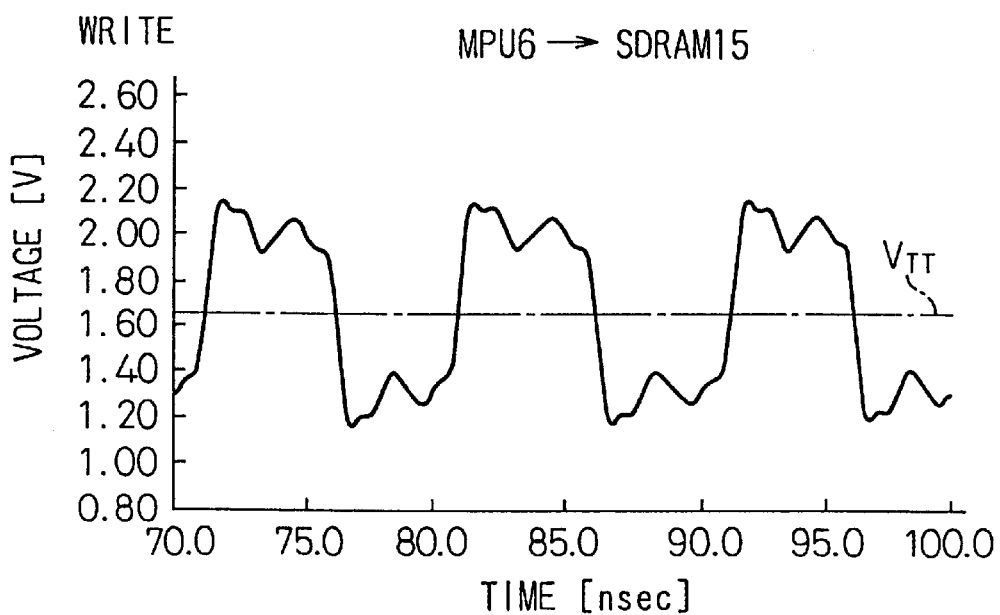
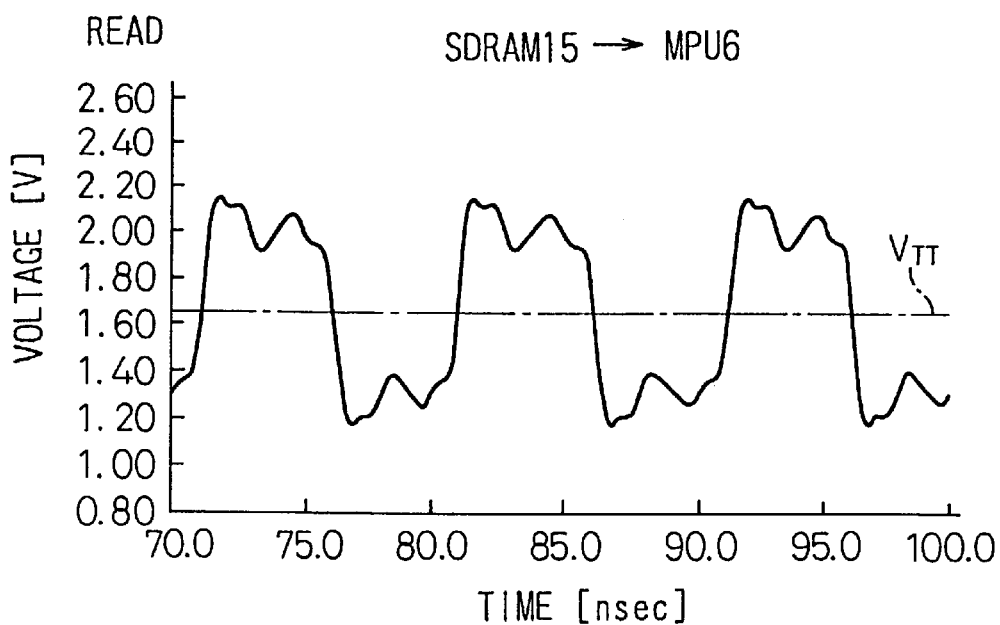

TO BUS 1 — TO STUB 10

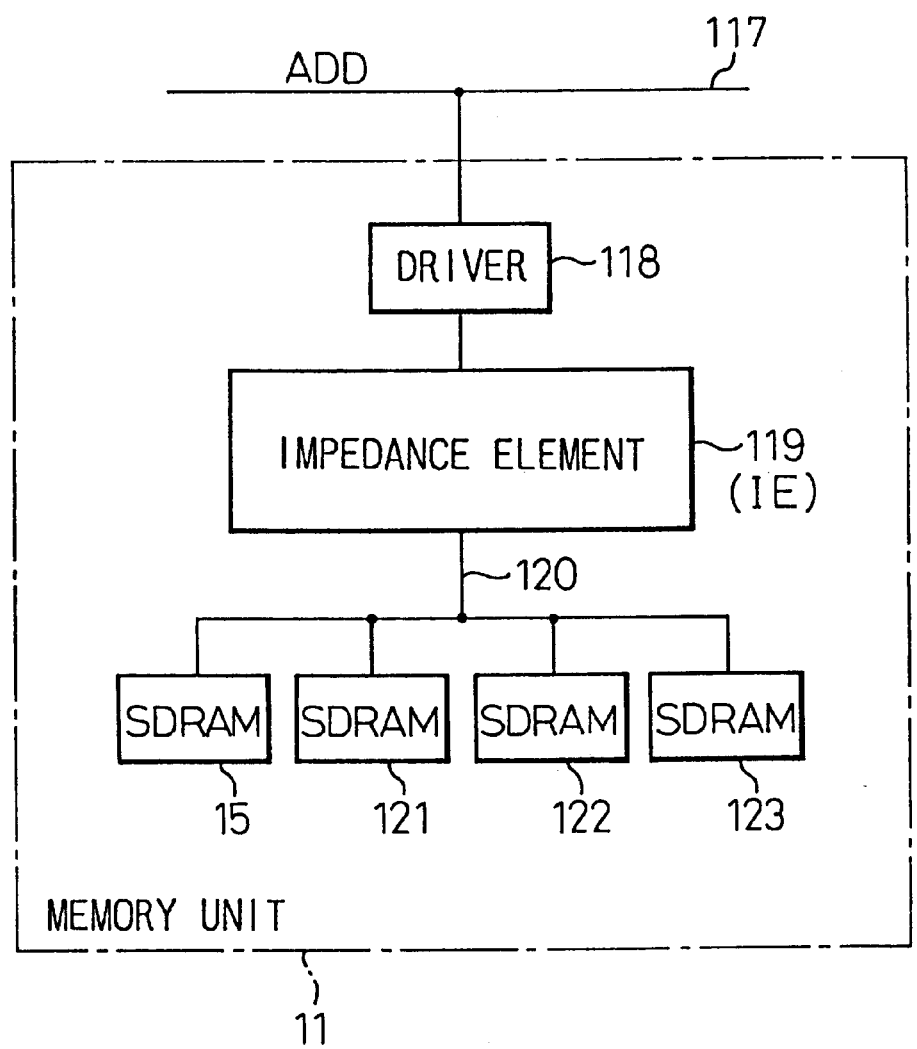

ELECTRONIC CIRCUIT APPARATUS FOR TRANSMITTING SIGNALS THROUGH A BUS AND SEMICONDUCTOR DEVICE FOR GENERATING A PREDETERMINED STABLE VOLTAGE

This application is a continuation of prior application Ser. No. 09/108,233 filed Jul. 1, 1998 now abandoned, which is a division of prior application Ser. No. 08/445,099 filed May 19, 1995, issued as U.S. Pat. No. 5,955,889 on Sep. 21, 1999.

BACKGROUND OF THE INVENTION

1. Field of the Invention

The present invention relates to an electronic circuit apparatus for transmitting signals through a bus. Further, the present invention also relates to a semiconductor device for generating a predetermined stable voltage.

2. Description of the Related Art

An electronic circuit apparatus is arranged on a printed board (mother board). The mother board, for example, comprises an MPU (microprocessor unit), a data transmission bus (data bus lines), a memory unit (memory modules), various extended boards, and the like.

By the way, clock frequencies of MPUs today are in excess of 100 MHz. Further, DRAMs (dynamic random access memories), used as a main memory, are built as the data server to cache memories in modern microprocessor systems. They operate mostly in burst-mode rather than in random access mode, in order to re-write the data in cache memories. High bandwidth memories such as SDRAMs (synchronous DRAMs) are thus useful for high-speed implementation in the burst-mode, along with high-speed I/O circuits for the bus interface.

Therefore, high performance I/O circuits for fast memory such as SDRAMs are now required. The problems of the prior art relating to a first aspect of the present invention (electronic circuit apparatus for transmitting signals through a bus) will be explained hereafter in detail with reference to the accompanying drawings.

On the other hand, recently, semiconductor devices must be compact and operate at a high speed and low power consumption. To realize this, it is necessary to provide the semiconductor devices with a high-speed clock signal and a low source voltage.

Namely, it is necessary to provide a semiconductor circuit capable of providing a stable source voltage as a cell plate voltage for a semiconductor memory such as a DRAM, or as a reference voltage for a small-amplitude I/O device. The problems of the prior art relating to a second aspect of the present invention (semiconductor device for generating a predetermined stable voltage) will be also explained hereafter in detail with reference to the accompanying drawings.

SUMMARY OF THE INVENTION

An object of the present invention (first aspect of the present invention) is to provide an electronic circuit apparatus for transmitting signals through a bus, capable of suppressing a ringing in a stub, preventing a delay in transmitting signals, increasing a transmission frequency, and improving a transmission speed.

Further, another object of the present invention (second aspect of the present invention) to provide a semiconductor circuit realizing a small output impedance at low power consumption.

According to a first aspect of the present invention, there is provided an electronic circuit apparatus having a bus, a plurality of stubs branched from the bus, and a plurality of semiconductor devices having signal input/output terminals connected to the corresponding stubs, wherein the electronic circuit apparatus comprises at least one impedance circuits arranged between the bus and at least one of the stubs, and each of the impedance circuit has a high-pass filter characteristic.

At least one end of the bus may be terminated by terminating resistor or both ends of the bus may be terminated by terminating resistors. A resistance value of the terminating resistor may be determined in a range of 25 to 75 ohms. In the electronic circuit apparatus, f×d may be equal to or smaller than $5 \times 10^6$; where f is a basic component frequency (Hz) of a signal transmitted through the bus, and d is a length (meters) of the stub.

The bus may be connected to a terminal voltage supplying line through the terminating resistor. The terminal voltage supplying line may be connected to a high potential power supply line through a first stabilizing capacitor and a low power supply line through a second stabilizing capacitor. The first and second stabilizing capacitors may be provided at both ends of the terminal voltage supplying line, and each end of the bus may be connected to an intermediate connection portion between the first and second stabilizing capacitors through the corresponding terminating resistor.

Further, according to a first aspect of the present invention, there is provided a connector for connecting a plurality of semiconductor devices having signal input/output terminals to corresponding stubs, the stubs being branched from a bus, wherein the connector comprises at least one impedance circuit arranged between the semiconductor devices and the stubs.

In addition, according to a first aspect of the present invention, there is also provide a memory module connected to a bus through a plurality of stubs branched from the bus, the memory module comprising a plurality of semiconductor memories having signal input/output terminals connected to the corresponding stubs, wherein the memory module comprises at least one impedance circuits arranged between the stubs and the semiconductor memories.

The impedance circuit has a high-pass filter characteristic, and is used to prevent ringing. The impedance circuit may be formed as an integrated element. The impedance circuit may comprises a resistor and a capacitor connected in parallel with the first resistor.

The impedance circuit may comprise a first resistor, a second resistor, and a capacitor, wherein the second resistor and the capacitor may be connected in series therewith and are connected in parallel with the first resistor.

A resistance value of the resistor may be determined to prevent ringing and to match an impedance of the stub with an impedance of the bus. A resistance value of the resistor may be determined in a range of 25 to 100 ohms, and a capacitance value of the capacitor may be determined in a range of 10 to 50 picofarads.

The impedance circuit may comprises a first resistor, a second resistor, and a capacitor, wherein the second resistor and the capacitor may be connected in parallel therewith and may be connected in series with the first resistor.

The first resistor and the second resistor may constitute one resistor, and a resistance value of the resistor may be determined to prevent ringing and to match an impedance of the stub with an impedance of the bus. A resistance value of the resistor may be determined in a range of 25 to 100 ohms, and a capacitance value of the capacitor may be determined in a range of 10 to 50 picofarads. A resistance value of the first resistor may be determined in a range of 5 to 20 ohms.

The impedance circuit may comprise a first resistor, a second resistor, and a capacitor, wherein the first resistor may be connected in series between the bus and the stub, one end of the second resistor may be connected to the bus and another end of the second resistor may be electrically open, and the capacitor may be arranged between the first resistor and the second resistor for constituting a distributed constant circuit.

A resistance value of the first resistor may be determined to prevent ringing and to match an impedance of the stub with an impedance of the bus. A resistance value of the first resistor may be determined in a range of 25 to 100 ohms.

The bus may be a data bus. An impedance circuit identical to that defined by the impedance circuit may be connected to an output of a driver that transmits a signal received through another bus to the semiconductor devices. The another bus may be an address bus.

The electronic circuit apparatus may be a mother board. The electronic circuit apparatus may be a mother memory board.

According to a second aspect of the present invention, there is provided a semiconductor circuit comprising a first power source unit, a second power source unit, a plurality of first-conductivity transistors, a plurality of second-conductivity transistors, the transistors being connected in series between the first and second power source units, and an output node between the first-conductivity transistor and the second-conductivity transistor, for providing an output.

A number of the series-connected second-conductivity transistors may be the same as a number of the series-connected first-conductivity transistors, and an arrangement of the transistors between the first power source unit and the output node may be the same as an arrangement of the transistors between the output node and the second power source unit. The first power source unit may be of high potential, the second power source unit may be of low potential, the first-conductivity transistors may be p-channel MOS transistors, and the second-conductivity transistors may be n-channel MOS transistors. A total number of the first-conductivity transistors and the second-conductivity transistors may be 4 by n; where n is a natural number.

A voltage of the output is an intermediate voltage between a voltage of the first power source unit and a voltage of the second power source unit. The first-conductivity transistors and the second-conductivity transistors may form diodes, respectively. The output may be connected to a control electrode of the first-conductivity transistor connected to the first power source unit and to a control electrode of the second-conductivity transistor connected to the second power source unit.

The output may serve as the substrate or well potential of the transistors other than the transistors that are connected to the first and second power source units, respectively. The difference between the threshold voltages of the first- and second-conductivity transistors may be equal to or less than 10% of a power source voltage.

The semiconductor circuit may further comprise a second-conductivity transistor and a first-conductivity transistor, these transistors being connected in series between the first power source unit and the second power source unit and forming a second output section that provides a second output, which is different from the first output. The second output may be provided from a node between the second-conductivity transistor and the first-conductivity transistor in the second output section, control electrodes of the transistors of the second output section may be connected to control electrodes of the transistors of the first output section, respectively.

The first output may serve as a substrate or well potential of the transistors of the second output section to provide the second output. An output from a control circuit may be applied to a control electrode of the first-conductivity transistor connected to the first power source unit and to a control electrode of the second-conductivity transistor connected to the second power source unit in the first output section, to accurately adjust the outputs.

The semiconductor circuit may further comprise a resistor arranged between the control circuit and the control electrodes of the transistors of the first output section. The control circuit may detect a difference between the first or second output and a reference voltage.

The second output may serve as a substrate or well potential of the transistors of the second output section to provide the second output. An output from a control circuit may be applied to a control electrode of the first-conductivity transistor connected to the first power source unit and to a control electrode of the second-conductivity transistor connected to the second power source unit in the first output section, to accurately adjust the outputs.

The semiconductor circuit may further comprise a resistor arranged between the control circuit and the control electrodes of the transistors of the first output section. The control circuit may detect a difference between the first or second output and a reference voltage.

The second output section may have a first-conductivity transistor arranged between the first power source units and the second-conductivity transistor, and a second-conductivity transistor arranged between the second power source unit and the first-conductivity transistor.

The second output may be connected to the control electrode of the first-conductivity transistor connected to the first power source unit and to the control electrode of the second-conductivity transistor connected to the second power source unit in the first output section. The first output may be connected to the control electrode of the first-conductivity transistor connected to the first power source unit and to the control electrode of the second-conductivity transistor connected to the second power source unit in the second output section.

BRIEF DESCRIPTION OF THE DRAWINGS

The present invention will be more clearly understood from the description of the preferred embodiments as set forth below with reference to the accompanying drawings, wherein:

FIGS. 7A and 7B are diagrams showing waveforms for explaining the effect of the first embodiment;

FIG. 28A is a diagram schematically showing a memory module employing the impedance element of FIGS. 5, 9, 12, and 15;

DESCRIPTION OF THE PREFERRED EMBODIMENTS

For a better understanding of the preferred embodiments, first, the problems of an electronic circuit apparatus according to the prior art will be explained.

Figure 1:
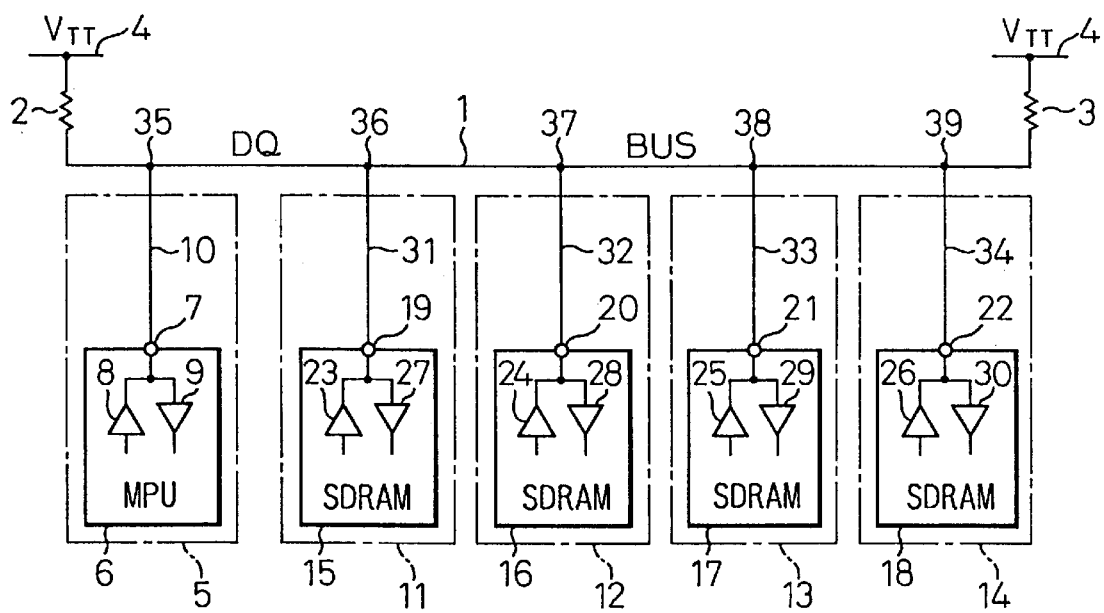
FIG. 1 is a circuit diagram showing an essential part of an electronic circuit apparatus according to a first prior art; example

FIG. 1 shows an essential part of an electronic circuit apparatus according to the prior art.

The electronic circuit apparatus is arranged on a printed board that is called a mother board. In FIG. 1, reference numeral 1 is a data transmission bus (bus lines) formed on the mother board, 2 and 3 are terminating resistors for terminating the bus 1, and 4 is a voltage line for supplying a terminal voltage VTT. Further, reference numeral 5 is a package accommodating an MPU (microprocessor unit), 6 is the MPU, 7 is a data input/output terminal of the MPU 6, 8 is a data output circuit of the MPU 6, and 9 is a data input circuit of the MPU 6. In addition, reference numeral 10 is a signal distribution line branched from the bus 1 and arranged in the package 5. This line 10 is, generally called as a stub.

Further, in FIG. 1, reference numerals 11 to 14 are memory modules attached to the mother board through connectors, and 15 to 18 are SDRAMs (synchronous dynamic random access memories) mounted on the memory modules 11 to 14, respectively.

In the SDRAMs 15 to 18, reference numerals 19 to 22 are data input/output terminals, 23 to 26 are data output circuits, and 27 to 30 are data input circuits. Note that, reference numerals 31 to 34 are signal distribution lines formed in the memory modules 11 to 14, respectively. These lines 31 to 34 are branched from the bus 1 and are also called stubs.

The data output circuit 8 of the MPU 6 sends a data signal DQ to the bus 1 through the stub 10. The data signal DQ is transmitted through the bus 1 toward the terminating resistors 2 and 3. The data signal DQ is branched at branch points 36 to 39 to the stubs 31 to 34, which guide the signal to the data input/output terminals 19 to 22 of the SDRAMs 15 to 18.

The stubs 31 to 34 are electrically open at their ends to totally reflect the data signal DQ that has been transmitted through the stubs 31 to 34 toward the data input/output terminals 19 to 22. As a result, the signal returns toward the bus 1 through the stubs 31 to 34.

The characteristic impedance of the bus 1 is usually 50 ohms. Namely, the impedance of the bus 1 is 50/2=25 ohms when viewed from the stubs 31 to 34. The characteristic impedance of each of the stubs 31 to 34 is usually in the range of 75 to 125 ohms if the memory modules 11 to 14 are SIMMs (single in-line memory modules) or DIMM (dual in-line memory modules). Namely, the impedance of each of the stubs 31 to 34 does not match with that of the bus 1.

Consequently, the signal that has been reflected by the ends of the stubs 31 to 34 toward the bus 1 is partly transmitted through the bus 1 and partly reflected by the branch points 36 to 39. Namely, part of the signal is repeatedly reflected between the ends of the stubs 31 to 34 and the branch points 36 to 39, to cause a ringing in the stubs 31 to 34.

The ringing becomes stronger as a transmission frequency increases. The ringing occurs even at a low transmission frequency if the lengths of the stubs 31 to 34 are long. Due to these problems, the electronic circuit apparatus of FIG. 1 is incapable of handling a high transmission frequency.

Figure 2:
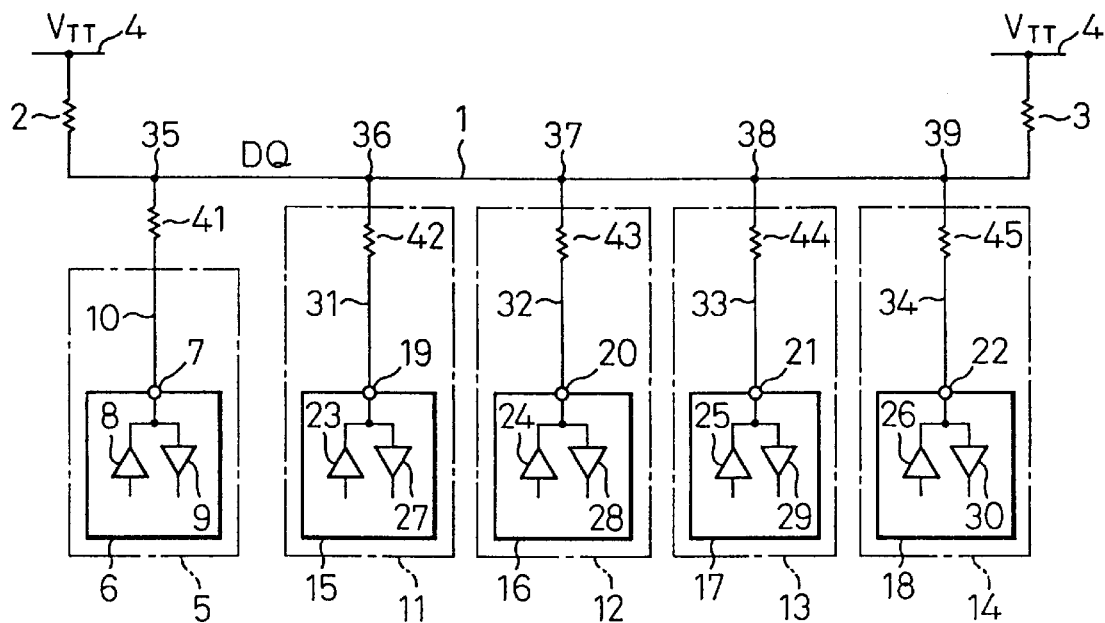
FIG. 2 is a circuit diagram showing an essential part of an electronic circuit apparatus according to a second prior art; example

The solve this problem, an electronic circuit apparatus of FIG. 2 according to another prior art has been proposed. This apparatus includes a bus 1, stubs 10 and 31 to 34, and resistors 41 to 45 inserted between the bus and the stubs. The resistors 41 to 45 absorb a ringing that may occur in the stubs 10 and 31 to 34, to thereby maintain the waveform of a signal and increase a transmission frequency.

The resistor 41 is formed on a mother board, and the resistors 42 to 45 are formed on memory modules 11 to 14, respectively. The resistance of each of the resistors 41 to 45 is RS, the characteristic impedance of the bus 1 is Z0, and the characteristic impedance of each of the stubs 31 to 34 is Z1. If Z1=RS+Z0/2, the resistors 42 to 45 serve to match the impedance of each of the stubs 31 to 34 with that of the bus 1.

In this case, a signal reflected by the open ends of the stubs 31 to 34 toward the bus 1 is not reflected by branch points 35 to 39, to thereby minimize a distortion in the waveform of the signal.

As explained above, the characteristic impedance Z0 of the bus 1 is usually 50 ohms, and the characteristic impedance Z1 of each of the stubs 31 to 34 is usually in the range of 75 to 125 ohms, so that the resistance RS of each of the resistors 42 to 45 must be in the range of 50 to 100 ohms to match the characteristic impedances with each other.

If two SDRAMs are connected to each of the stubs 42 to 45, the input capacitance of the load devices viewed from each of the stubs 31 to 34 will be 10 picofarads (pF).

Figure 3A:
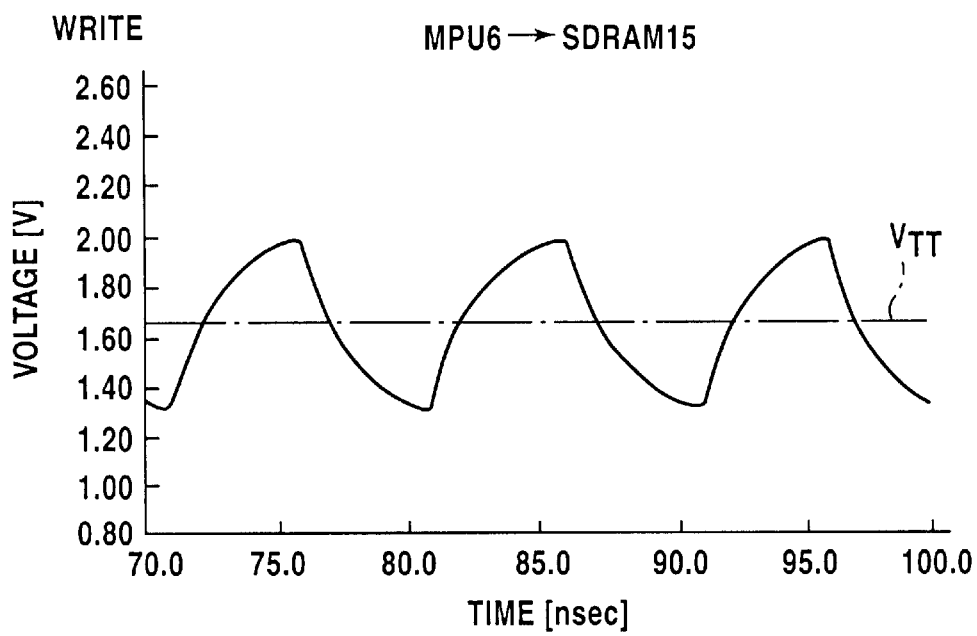
FIGS. 3A and 3b are diagrams showing waveforms for explaining the problems of the electronic circuit apparatus of FIG. 2.
Figure 3B:
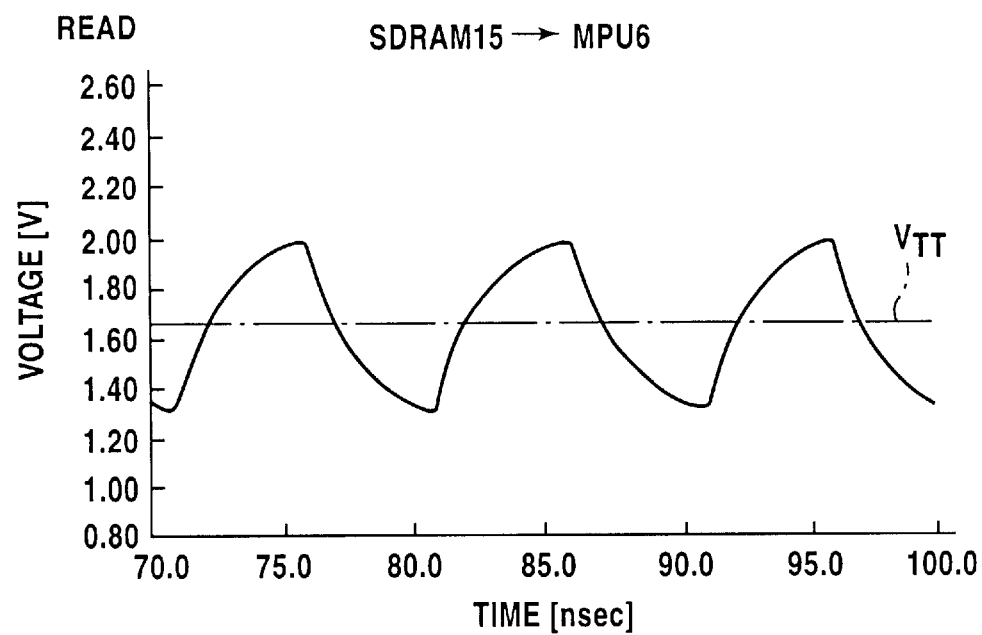

In this case, each of the resistors 42 to 45 and the input capacitance of the two SDRAMs form a high-cut filter to cut the high-frequency components of a transmission signal, as shown in FIGS. 3A and 3B. This results in removing sharpness from the signal and causing a delay in the signal.

The graphs of FIGS. 3A and 3B are obtained with the terminal voltage VTT being 1.65V, the resistance value RTT of each of the terminating resistors 2 and 3 being 50 ohms, and the resistance value RS of each of the resistors 41 to 45 being 65 ohms.

FIG. 3A shows the waveform of a signal at the end of the stub 31, i.e., at the data input/output terminal 19 of the SDRAM 15 when the MPU 6 writes data DQ into the SDRAM 15. FIG. 3B shows the waveform of a signal at the end of the stub 10, i.e., at the data input/output terminal 7 of the MPU 6 when the MPU 6 reads data DQ out of the SDRAM 15.

Next, embodiments of an electronic circuit apparatus according to the present invention (first aspect of the present invention) will be explained with reference to FIGS. 4 to 30.

First, the summary of the first aspect of the present invention will be explained. The electronic circuit apparatus of the present invention has a bus (bus lines) terminated by terminating resistors, stubs branched from the bus, and semiconductor devices having signal input/output terminals connected to the stubs, respectively. An improvement in the electronic circuit apparatus consists of an impedance circuit arranged between the bus and any one of the stubs that must prevent a ringing. The impedance circuit has a series-connected resistor and provides a high-pass filter characteristic.

The impedance circuit having the series-connected resistor is arranged between the bus and the stub that must prevent a ringing, to suppress the ringing. The impedance circuit arranged between the bus and the stub that must prevent a ringing has a high-pass filter characteristic. Even if the resistor connected in series between the bus and the stub that must prevent a ringing and a load device form a high-cut filter, the impedance circuit prevents the high-frequency components of a transmission signal from attenuating, to thereby keep the sharpness of the signal and cause no delay.

In this way, the present invention prevents a ringing in a stub or an attenuation in the high-frequency components of a transmission signal, to thereby maintain the sharpness of the signal and cause no delay. The present invention is effective to increase a transmission frequency and a transmission speed.

First to sixteenth embodiments of the present invention will be explained with reference to FIGS. 4 through 28. The same reference marks as those of FIG. 2 represent like parts through FIGS. 4, 8, 11, 13, and 16 to 28, and these parts are not explained again.

A first embodiment of an electronic circuit apparatus according to the present invention will be explained with reference to FIGS. 4 to 7.

Figure 4:
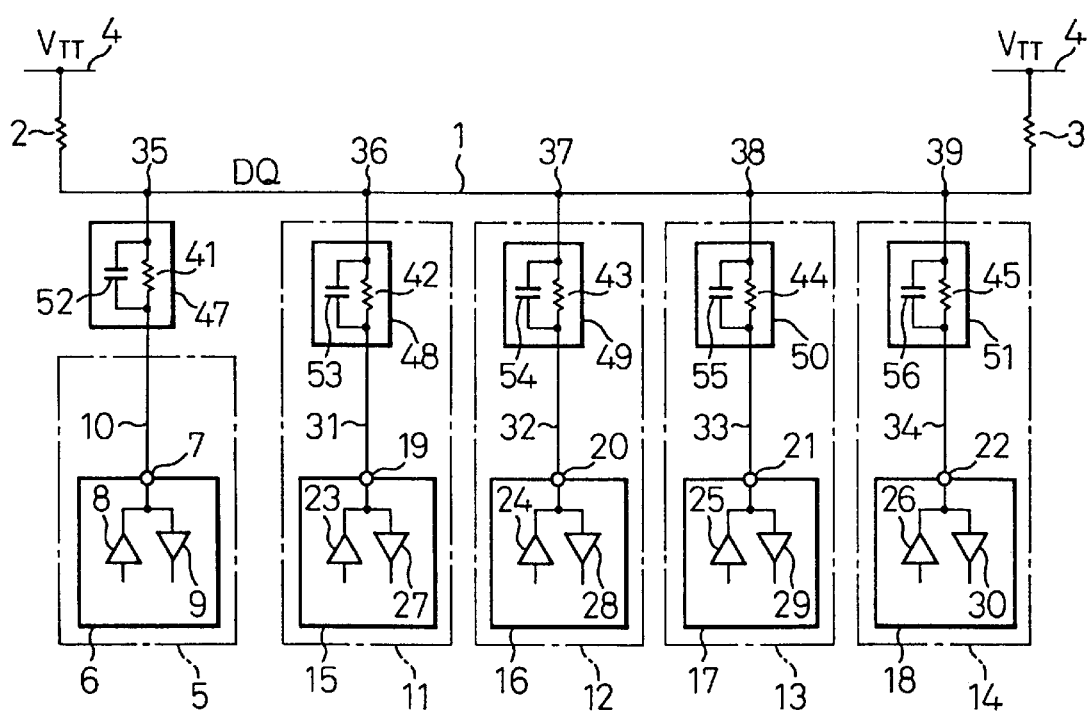
FIG. 4 is a circuit diagram showing an essential part of a first embodiment according to the present invention.

FIG. 4 shows an essential part of the first embodiment of the present invention. The first embodiment employs impedance circuits 47 to 51 instead of the resistors 41 to 45 of the prior art of FIG. 2. The other parts of the first embodiment are the same as the prior art.

The impedance circuit 47 is arranged on a mother board, and the impedance circuits 48 to 51 are arranged on memory modules 11 to 14, respectively. The impedance circuits 47 to 51 have resistors 41 to 45 that are connected in parallel with capacitors 52 to 56, respectively. Each of the impedance circuits is an integrated impedance element whose sectional diagram is shown in FIG. 5.

Figure 5:
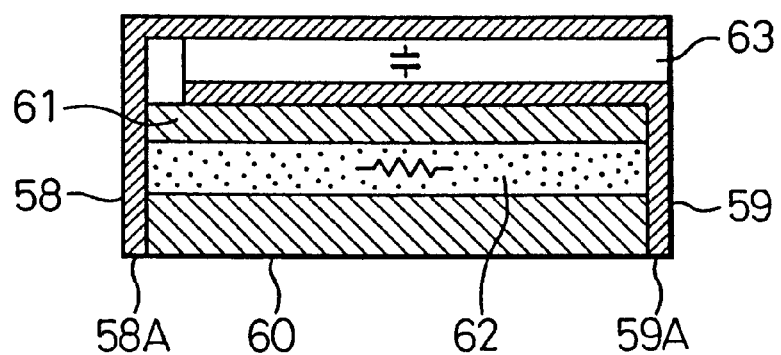
FIG. 5 is a sectional diagram showing an impedance circuit according to the first embodiment.

In FIG. 5, the impedance element has electrodes 58 and 59, insulator layers 60 and 61, a resistor layer 62, and a dielectric layer 63. The impedance element is used as, for example, the impedance circuit 48 with the resistor layer 62 serving as the resistor 42 and the dielectric layer 63 serving as the capacitor 53.

Figure 6:
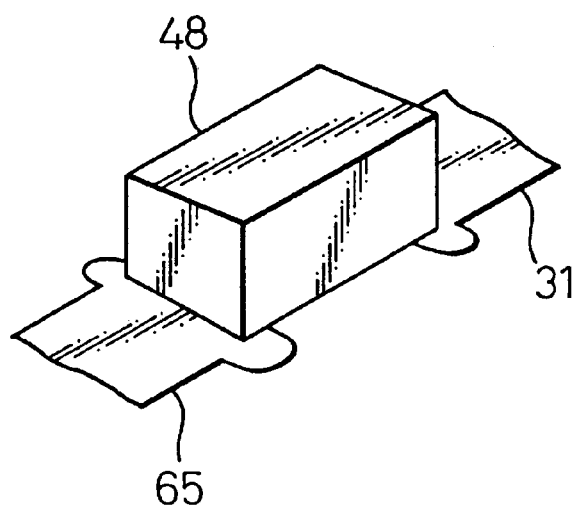
FIG. 6 is a perspective diagram showing an installed state of the impedance element of FIG. 5.

To install the impedance element on the mother board or on any one of the memory modules 11 to 14, lower ends 58A and 59A of the electrodes 58 and 59 are soldered to wiring. FIG. 6 shows the impedance element installed as the impedance circuit 48. In FIG. 6, a reference numeral 65 is wiring joined with a connector.

The electrodes 58 and 59 may be of zinc, the insulator layers 60 and 61 may be made of alumina ceramics, the resistor layer 62 may be made of carbon, and the dielectric layer 63 may be made of barium titanate, titanium oxide, strontium titanium oxide, or titanium lead zirconate.

A bus 1 is connected to load such as parasitic capacitance at each connector and the input capacitance of SDRAMs 15 to 18. Accordingly, the bus 1 is slightly capacitive compared with the characteristic impedance (pure resistance) thereof.

When a signal source is connected to an open end of the stub 31, a signal from the signal source is correctly transmitted to terminating resistors 2 and 3 if RTT/RS=(CL/CP$^{-1}$) where CL is the load capacitance of the bus 1, RS is the resistance of the resistor 42, CP is the capacitance of the capacitor 53, and RTT is the resistance of each of the terminating resistors 2 and 3.

This is because the level of the signal is divided without regard to the frequency of the signal passing through a branch point 36 if a resistance division ratio RTT/RS is equal to an inverse (CL/CP)$^{-1}$ of a capacitance division ratio CL/CP.

Since the bus 1 has the parasitic load capacitance CL, the capacitors 53 to 56 must be connected in parallel with the resistors 42 to 45, respectively, to prevent an attenuation in the high-frequency components of a transmission signal and transmit the signal at a high speed. If the capacitors 53 to 56 are not provided, the high-frequency components of a transmission signal attenuate so that the signal may not be transmitted at a high speed.

FIGS. 7A and 7B show the waveforms of signals transmitted with the terminal voltage VTT being 1.65V, the resistance value RTT of each of the terminating resistors 2 and 3 being 50 ohms, the resistance of each of the resistors 41 to 45 being 65 ohms, the capacitance of each of the capacitors 52 to 56 being 30 picofarads, and the input capacitance of each load device viewed from the stubs 31 to 34 being 10 picofarads. FIG. 7A shows the waveform of a signal at an end of the stub 31, i.e., at a data input/output terminal 19 of the SDRAM 15 when an MPU 6 writes data DQ into the SDRAM 15.

FIG. 7B shows the waveform of a signal at an end of a stub 10, i.e., at a data input/output terminal 7 of the MPU 6 when the MPU 6 reads data DQ out of the SDRAM 15.

In this way, the first embodiment arranges the resistors 41 to 45 between the stubs 10 and 31 to 34 and the bus 1, to prevent a ringing in the stubs 10 and 31 to 34.

The first embodiment arranges the capacitors 52 to 56 in parallel with the resistors 41 to 45, respectively, so that the impedance circuit 47 to 51 may have a high-pass filter characteristic to prevent an attenuation in the high-frequency components of transmission signal, maintain the sharpness of the signal, and suppress a delay in the signal.

Therefore, the first embodiment is capable of increasing a transmission frequency and a transmission speed further than the electronic circuit apparatus of the prior art of FIG. 2.

According to the first embodiment, it is preferable to set the resistance RTT of each of the terminating resistors 2 and 3 within the range of 25 to 75 ohms, the resistance RS of each of the resistors 41 to 45 within the range of 25 to 100 ohms, and the capacitance of each of the capacitors 52 to 56 within the range of 10 to 50 picofarads.

Further, according to the first embodiment, it is also preferable to set f×d equal to or smaller than 5×106 where f is the basic component frequency (Hz) of a signal transmitted through the bus 1, and d is the length (meters) of each of the stubs 10 and 31 to 34. This is because the effect of the impedance circuits 47 to 51 decreases when f×d is larger than 5×106.

Next, a second embodiment of an electronic circuit apparatus according to the present invention will be explained with reference to FIGS. 8 to 10.

Figure 8:
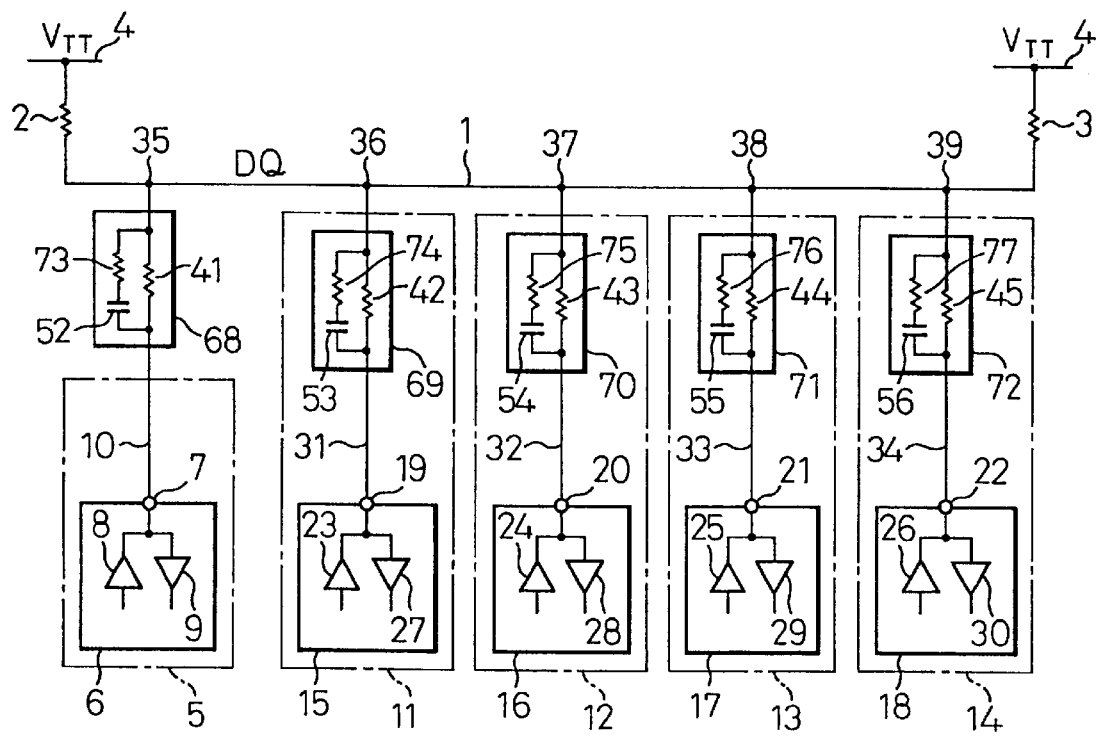
FIG. 8 is a circuit diagram showing an essential part of a second embodiment according to the present invention.

FIG. 8 is a circuit diagram showing an essential part of the second embodiment of the present invention. The second embodiment employs impedance circuits 68 to 72 instead of the impedance circuits 47 to 51 of FIG. 4. The other parts are the same as the first embodiment of FIG. 4.

The impedance circuits 68 to 72 have capacitors 52 to 56 that are connected in series with resistors 73 to 77, respectively, and the rest are the same as the impedance circuits 47 to 51 of FIG. 4.

The resistors 73 to 77 are damping resistors for suppressing an overshoot or undershoot that may be caused by the capacitors 52 to 56.

Figure 9:
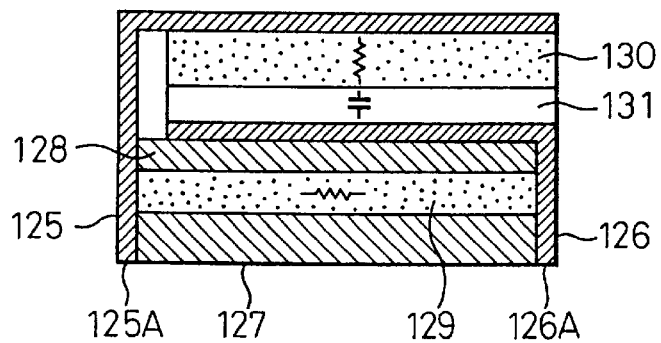
FIG. 9 is a sectional diagram showing an impedance circuit according to the second embodiment.

Each of the impedance circuits 68 to 72 may be an integrated impedance element whose sectional diagram is shown in FIG. 9.

In FIG. 9, the impedance element has electrodes 125 and 126, insulator layers 127 and 128, resistor layers 129 and 130, and a dielectric layer 131. The impedance element is used as, for example, the impedance circuit 69 with the resistor layer 129 serving as the resistor 42, the resistor layer 130 serving as the damping resistor 74, and the dielectric layer 131 serving as the capacitor 53.

To install the impedance element on a mother board or on any one of memory modules 11 to 14, lower ends 125A and 126A of the electrodes 125 and 126 are soldered to wiring.

The electrodes 125 and 126 may be made of zinc, the insulator layers 127 and 128 may be made of alumina ceramics, the resistor layers 129 and 130 may be made of carbon, and the dielectric layer 131 may be made of barium titanate, titanium oxide, strontium titanium oxide, or titanium lead zirconate.

As explained in the first embodiment, a bus 1 involves parasitic load capacitance CL. Accordingly, the capacitors 53 to 56 must be connected in parallel with the resistors 42 to 45, respectively, to prevent an attenuation in the high-frequency components of a transmission signal and transmit the signal at a high speed. If the capacitors 53 to 56 are not provided, the high-frequency components of a transmission signal attenuate so that the signal may not be transmitted at a high speed.

In more detail, however, connectors with which the stubs 31 to 34 are joined cause parasitic inductance. Accordingly, the parasitic inductance and the capacitors 53 to 56 cause a series resonance, which may cause an overshoot. The overshoot is not ignorable when the parasitic inductance is large.

The damping resistors 74 to 77 connected in series with the capacitors 53 to 56, respectively, according to the second embodiment damp an overshoot in a transmission signal due to the series resonance between the parasitic inductance and the capacitors 53 to 56.

Figure 10A:
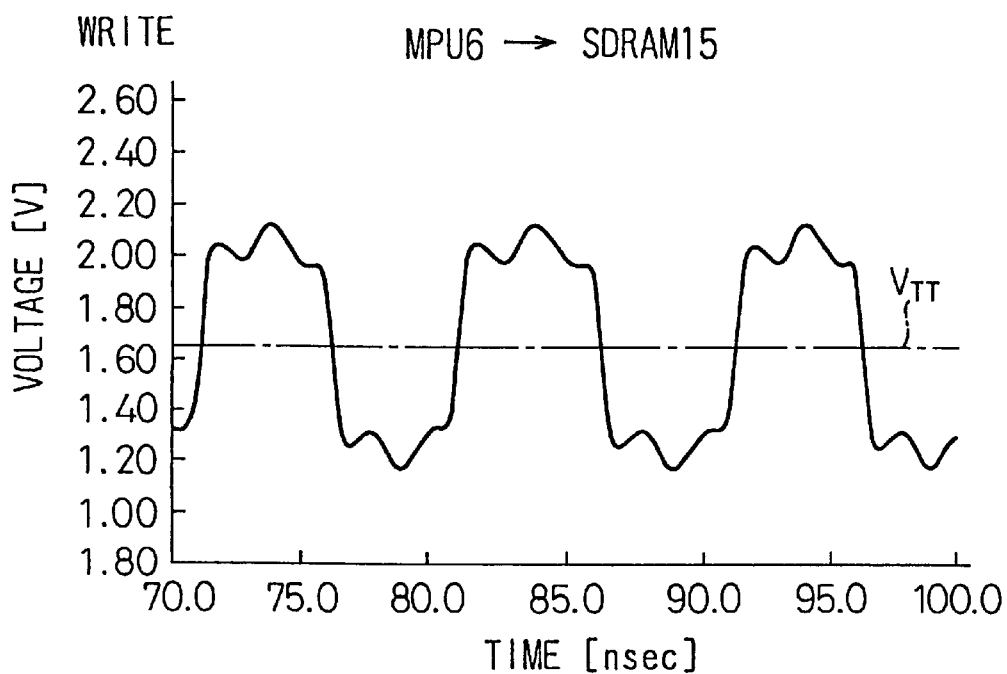
FIGS. 10A and 10B are diagrams showing waveforms for explaining the effect of the second embodiment.

FIGS. 10A and 1B show the waveforms of signals transmitted with a terminal voltage VTT of 1.65V, a resistance RTT of each of terminating resistors 2 and 3 of 50 ohms, a resistance of each of the resistors 41 to 45 of 65 ohms, a capacitance of each of the capacitors 52 to 56 of 30 picofarads, a resistance of each of the resistors 73 to 77 of 10 ohms, and an input capacitance of each load device viewed from the stubs 31 to 34 of 10 picofarads. FIG. 10A shows the waveform of a signal at an end of the stub 31, i.e., at a data input/output terminal 19 of the SDRAM 15 when an MPU 6 writes data DQ into the SDRAM 15.

Figure 10B:
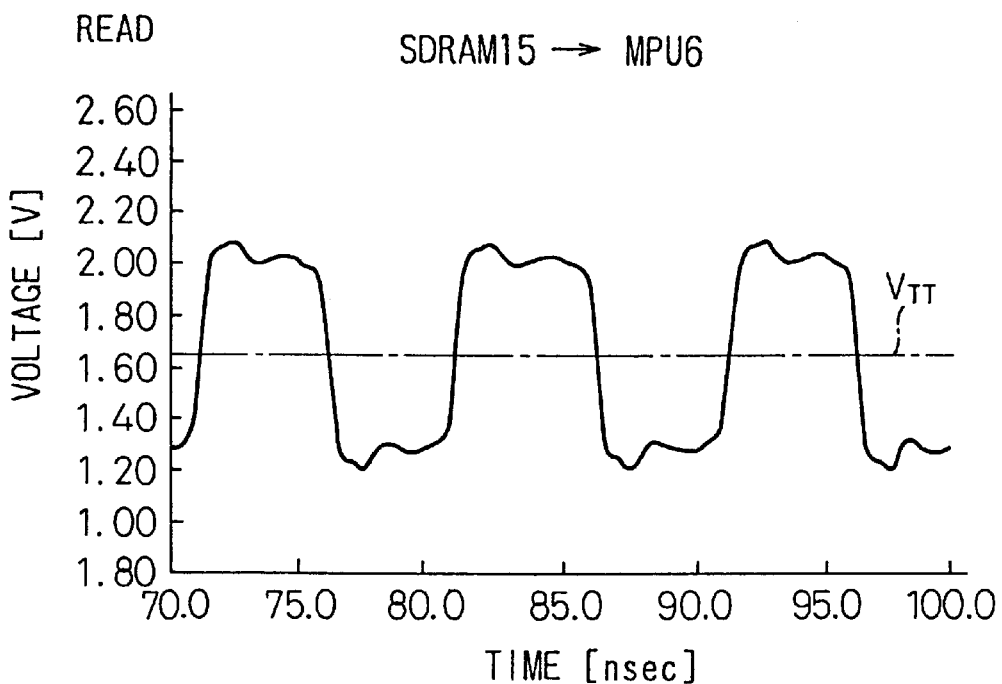

FIG. 10B shows the waveform of a signal at an end of a stub 10, i.e., at a data input/output terminal 7 of the MPU 6 when the MPU 6 reads data DQ out of the SDRAM 15.

In this way, the second embodiment arranges the resistors 41 to 45 between the stubs 10 and 31 to 34 and the bus 1, to prevent a ringing in the stubs 10 and 31 to 34.

The second embodiment arranges the capacitors 52 to 56, so that the impedance circuits 68 to 72 may have a high-pass filter characteristic, to prevent an attenuation in the high-frequency components of a transmission signal, maintain the sharpness of the signal, and suppress a delay in the signal.

The second embodiment arranges the resistors 73 to 77 in series with the capacitors 52 to 56, respectively, to suppress an overshoot that may be caused by the capacitors 52 to 56.

Accordingly, the second embodiment is capable of increasing a transmission frequency and a transmission speed further than the first embodiment.

When the bus involves a driver that changes a voltage at a high speed, a high-speed change in a transmission signal, i.e., a high-frequency component in the signal supplies resonance energy to an LC resonance section consisting of the parasitic inductance and parasitic capacitance of the bus, to disturb the waveform of the signal. Accordingly, the voltage changing speed of the driver must be limited.

The second embodiment, however, is capable of adjusting the resistance of the damping resistors 73 to 77, to supply an optimum signal to the bus 1 even if the driver changes the voltage at a high speed. Namely, the second embodiment provides a novel feature of removing a limit on the performance of the driver.

The damping resistors 73 to 77 can adjust the waveform of a transmission signal. Accordingly, after manufacturing an LSI including the MPU 6 and SDRAMs 15 to 18, the damping resistors 73 to 77 may be adjusted to optimize the waveform of a signal to be transmitted through the wiring of a mother board and the memory modules 11 to 14. This is a practical advantage of the second embodiment applicable to LSIs.

The connection of the impedance circuits 68 to 72 may be inverted. Since it is preferable not to increase the parasitic capacitance of the bus 1, the connection of FIG. 8 is preferable.

According to the second embodiment of the present invention, it is preferable to set the resistance RTT of each of the terminating resistors 2 and 3 within the range of 25 to 75 ohms, the resistance RS of each of the resistors 41 to 45 within the range of 25 to 100 ohms, the capacitance of each of the capacitors 52 to 56 within the range of 10 to 50 picofarads, and the resistance of each of the resistors 73 to 77 within the range of 5 to 20 ohms.

It is preferable to set f×d equal to or smaller than 5×106 where f is the basic component frequency (Hz) of a signal transmitted through the bus 1, and d is the length (meters) of each of the stubs 10 and 31 to 34. This is because the effect of the impedance circuits 68 to 72 decreases when f×d is larger than 5×106.

Further, a third embodiment of an electronic circuit apparatus according to the present invention will be explained with reference to FIGS. 11 and 12.

Figure 11:
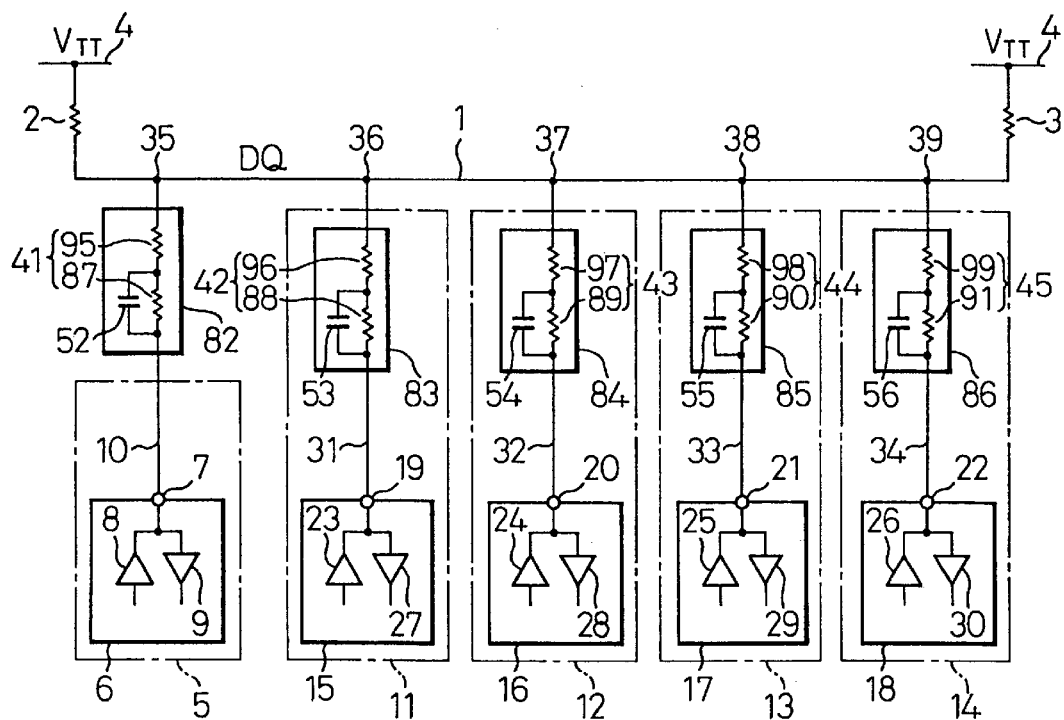
FIG. 11 is a circuit diagram showing an essential part of a third embodiment of the present invention.

FIG. 11 is a circuit diagram showing an essential part of the third embodiment of the present invention. The third embodiment employs impedance circuits 82 to 86 instead of the impedance circuits 47 to 51 of FIG. 4. The other parts are the same as the first embodiment of FIG. 4.

The impedance circuits 82 to 86 have capacitors 52 to 56 that are connected in parallel with parts 87 to 91 of resistors 41 to 45 adjacent to stubs 10 and 31 to 34.

The parts 87 to 91 of the resistors 41 to 45 have each a resistance of 55 ohms, and parts 95 to 99 of the resistors 41 to 45 adjacent to a bus 1 have each a resistance of 10 ohms.

Figure 12:
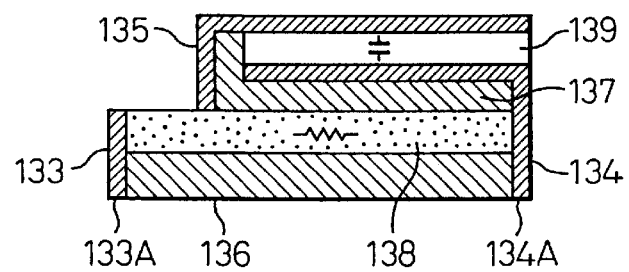
FIG. 12 is a sectional diagram showing an impedance circuit according to the third embodiment.

Each of the impedance circuits 82 to 86 may be an integrated impedance element whose sectional diagram is shown in FIG. 12.

In FIG. 12, the impedance element has electrodes 133 to 135, insulator layers 136 and 137, a resistor layer 138, and a dielectric layer 139. The impedance element is used as, for example, the impedance circuit 83 with the resistor layer 138 serving as the resistor 42 and the dielectric layer 139 serving as the capacitor 53.

To install the impedance element on a mother board or on any one of memory modules 11 to 14, lower ends 133A and 134A of the electrodes 133 and 134 are soldered to wiring.

The electrodes 133 to 135 may be made of zinc, the insulator layers 136 and 137 may be made of alumina ceramics, the resistor layer 138 may be made of carbon, and the dielectric layer 139 may be made of barium titanate, titanium oxide, strontium titanium oxide, or titanium lead zirconate.

In this way, the third embodiment arranges the resistors 41 to 45 between the stubs 10 and 31 to 34 and the bus 1, to prevent a ringing in the stubs 10 and 31 to 34.

The third embodiment arranges the capacitors 52 to 56, so that the impedance circuits 82 to 86 may have a high-pass filter characteristic, to prevent an attenuation in the high-frequency components of a transmission signal, maintain the sharpness of the signal, and suppress delay in the signal.

The parts 95 to 99 of the resistors 41 to 45 adjacent to the bus 1 are not connected in parallel with the capacitors 52 to 56, so that the parts 95 to 99 suppress an overshoot or undershoot that may be caused by the capacitors 52 to 56.

Accordingly, similar to the second embodiment, the third embodiment is capable of increasing a transmission frequency and a transmission speed further than the first embodiment.

The connection of the impedance circuits 82 to 86 may be inverted. Since it is preferable not to increase the parasitic capacitance of the bus 1, the connection of FIG. 11 is preferable.

According to the third embodiment, it is preferable to set the resistance RTT of each of terminating resistors 2 and 3 within the range of 25 to 75 ohms, the resistance RS of each of the resistors 41 to 45 within the range of 25 to 100 ohms, and the capacitance of each of the capacitors 52 to 56 within the range of 10 to 50 picofarads.

It is preferable to set f×d equal to or smaller than 5×106 where f is the basic component frequency (Hz) of a signal transmitted through the bus 1, and d is the length (meters) of each of the stubs 10 and 31 to 34. This is because the effect of the impedance circuits 82 to 86 decreases when f×d is larger than 5×106.

A fourth embodiment of an electronic circuit apparatus according to the present invention will be explained with reference to FIGS. 13 to 15.

Figure 13:
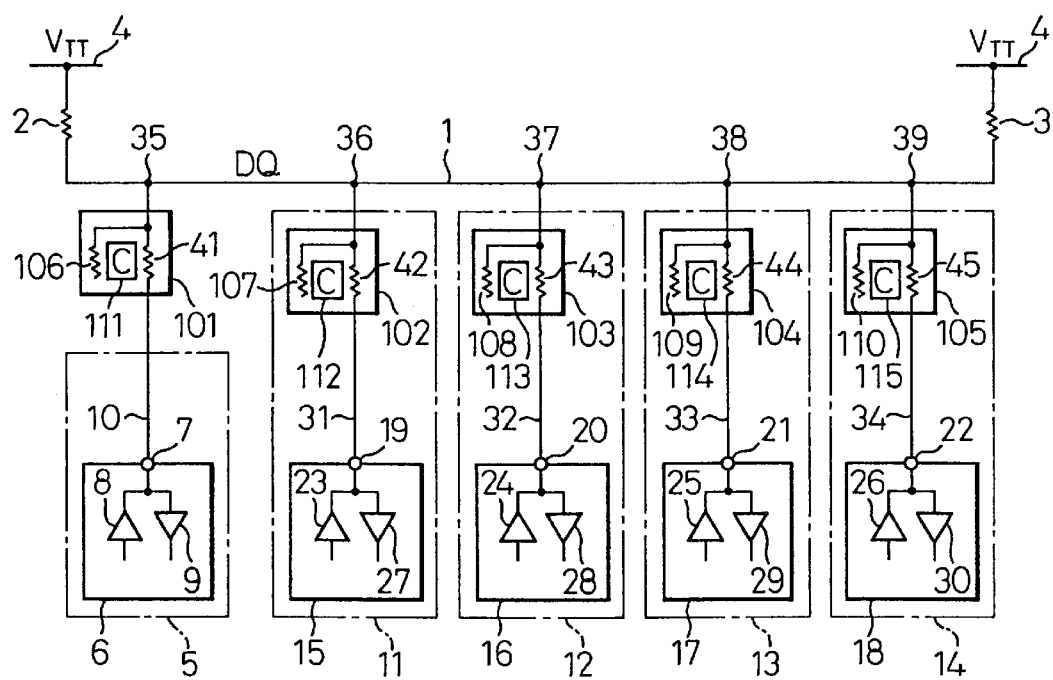
FIG. 13 is a circuit diagram showing an essential part of a fourth embodiment of the present invention.
Figure 14:
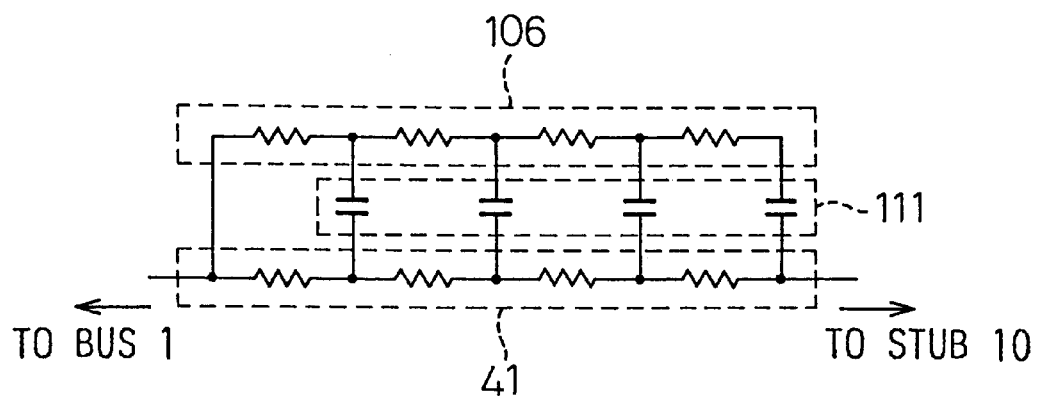
FIG. 14 is an equivalent circuit diagram of an impedance circuit according to the fourth embodiment.

FIG. 13 is a circuit diagram showing an essential part of the fourth embodiment of the present invention. The fourth embodiment employs impedance circuits 101 to 105 instead of the impedance circuits 47 to 51 of FIG. 4. The other parts are the same as those of the first embodiment of FIG. 4.

The impedance circuits 101 to 105 have resistors 41 to 45, resistors 106 to 110, and capacitors 111 to 115 forming distributed constant circuits between the resistors 41 to 45 and the resistors 106 to 110. FIG. 14 shows an equivalent circuit of the impedance circuit 101.

Figure 15:
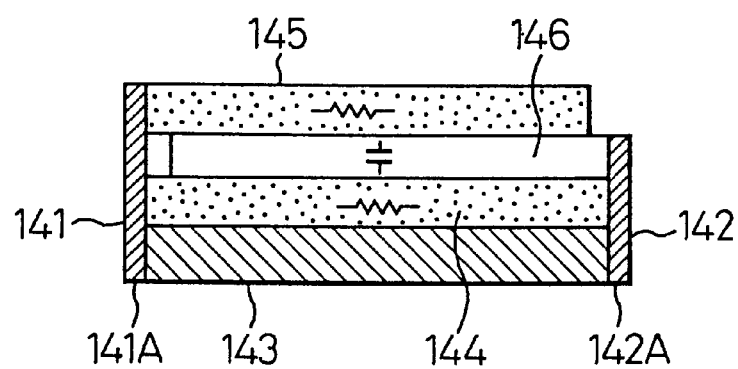
FIG. 15 is a sectional diagram showing the impedance circuit according to the fourth embodiment.

Each of the impedance circuits 101 to 105 may be an integrated impedance element whose sectional diagram is shown in FIG. 15.

In FIG. 15, the impedance element has electrodes 141 and 142, an insulator layer 143, resistor layers 144 and 145, and a dielectric layer 146. The impedance element is used as, for example, the impedance circuit 102 with the resistor layer 144 serving as the resistor 42, the resistor layer 145 serving as the damping resistor 107, and the dielectric layer 146 serving as the capacitor 112.

To install the impedance element on a mother board or on any one of memory modules 11 to 14, lower ends 141A and 142A of the electrodes 141 and 142 are soldered to wiring.

The electrodes 141 and 142 may be made of zinc, the insulator layer 143 may be made of alumina ceramics, the resistor layers 144 and 145 may be made of carbon, and the dielectric layer 146 may be made of barium titanate, titanium oxide, strontium titanium oxide, or titanium lead zirconate.

In this way, the fourth embodiment arranges the resistors 41 to 45 between the stubs 10 and 31 to 34 and the bus 1, to prevent a ringing in the stubs 10 and 31 to 34.

The fourth embodiment arranges the capacitors 111 to 115 forming distributed constant circuits between the resistors 41 to 45 and the resistors 106 to 110, so that the impedance circuits 101 to 105 may have a high-pass filter characteristic to prevent an attenuation in the high-frequency components of a transmission signal, maintain the sharpness of the signal, and suppress delay in the signal.

The resistors 106 to 110 suppress an overshoot or undershoot that may be caused by the capacitors 111 to 115.

Accordingly, similar to the second embodiment, the fourth embodiment is capable of increasing a transmission frequency and a transmission speed further than the first embodiment.

The connection of the impedance circuits 101 to 105 may be inverted. Since it is preferable not to increase the parasitic capacitance of the bus 1, the connection of FIG. 13 is preferable.

It is preferable to set f×d equal to or smaller than 5×106 where f is the basic component frequency (Hz) of a signal transmitted through the bus 1, and d is the length (meters) of each of the stubs 10 and 31 to 34. This is because the effect of the impedance circuits 101 to 105 decreases when f×d is larger than 5×106.

In addition, a fifth embodiment of an electronic circuit apparatus according to the present invention will be explained with reference to FIG. 16.

Figure 16:
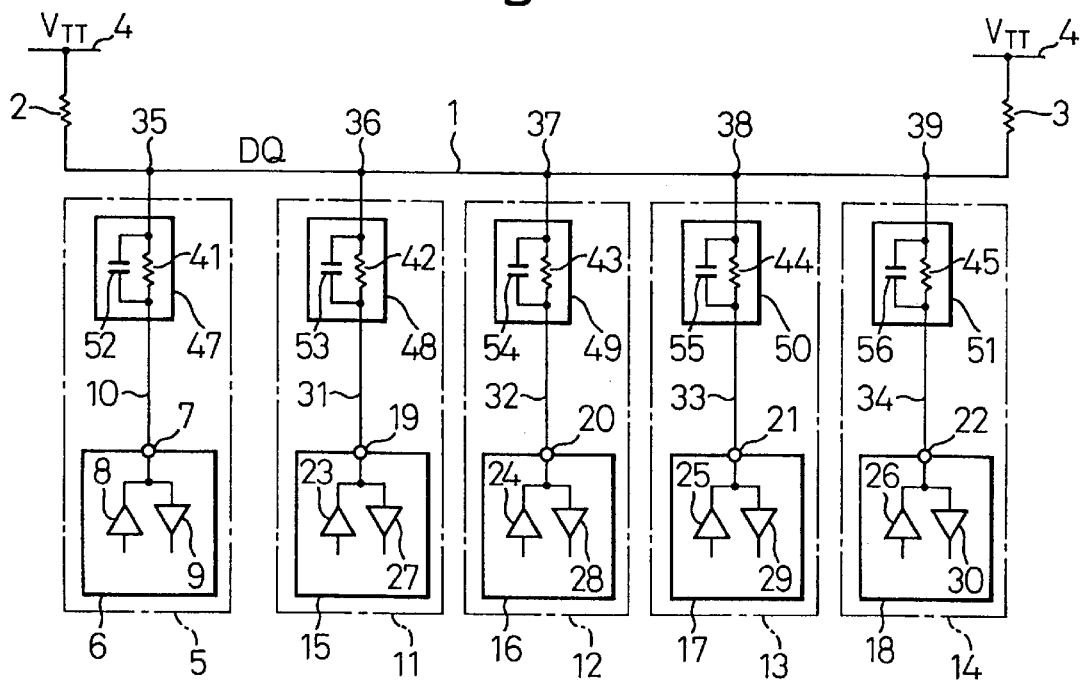
FIG. 16 is a circuit diagram showing an essential part of a fifth embodiment of the present invention.

FIG. 16 is a circuit diagram showing an essential part of the fifth embodiment of the present invention. This embodiment incorporates an impedance circuit 47 in a package 5, and the other parts thereof are the same as those of the first embodiment of FIG. 4.

Similar to the first embodiment, the fifth embodiment improves a transmission frequency and a transmission speed.

Next, a sixth embodiment of an electronic circuit apparatus according to the present invention will be explained with reference to FIG. 17.

Figure 17:
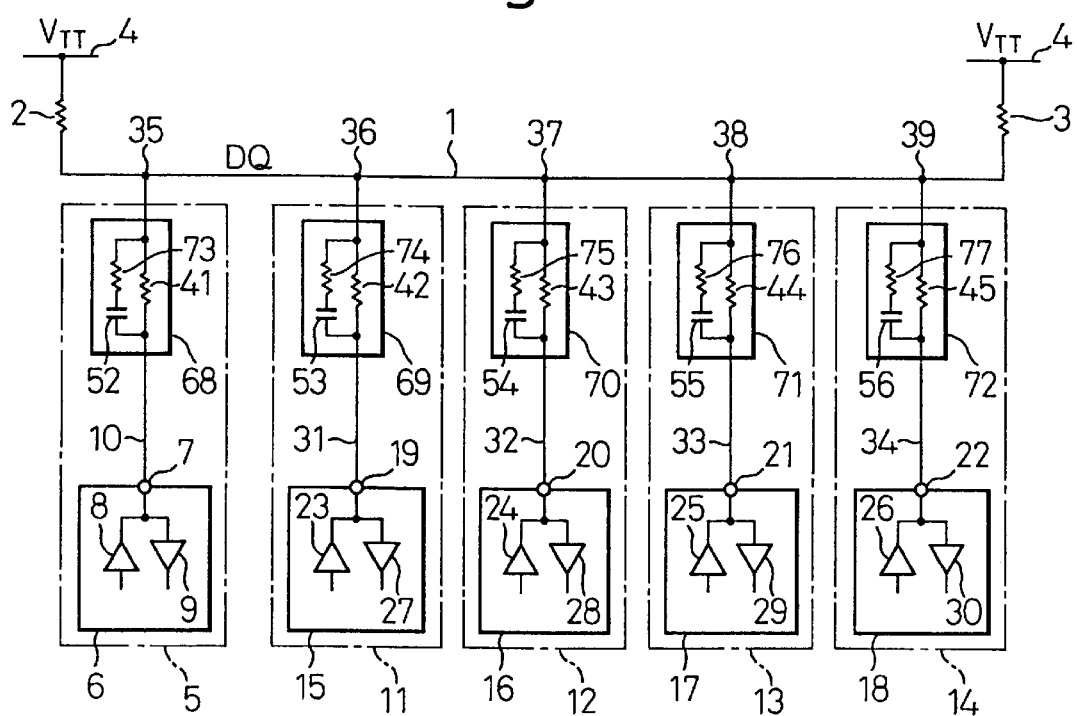
FIG. 17 is a circuit diagram showing an essential part of a sixth embodiment of the present invention.

FIG. 17 shows an essential part of the sixth embodiment of the present invention. This embodiment incorporates an impedance circuit 68 in a package 5, and the other parts thereof are the same as those of the second embodiment of FIG. 8.

Similar to the second embodiment, the sixth embodiment improves a transmission frequency and a transmission speed.

Further, a seventh embodiment, of an electronic circuit apparatus according to the present invention will be explained with reference to FIG. 18.

Figure 18:
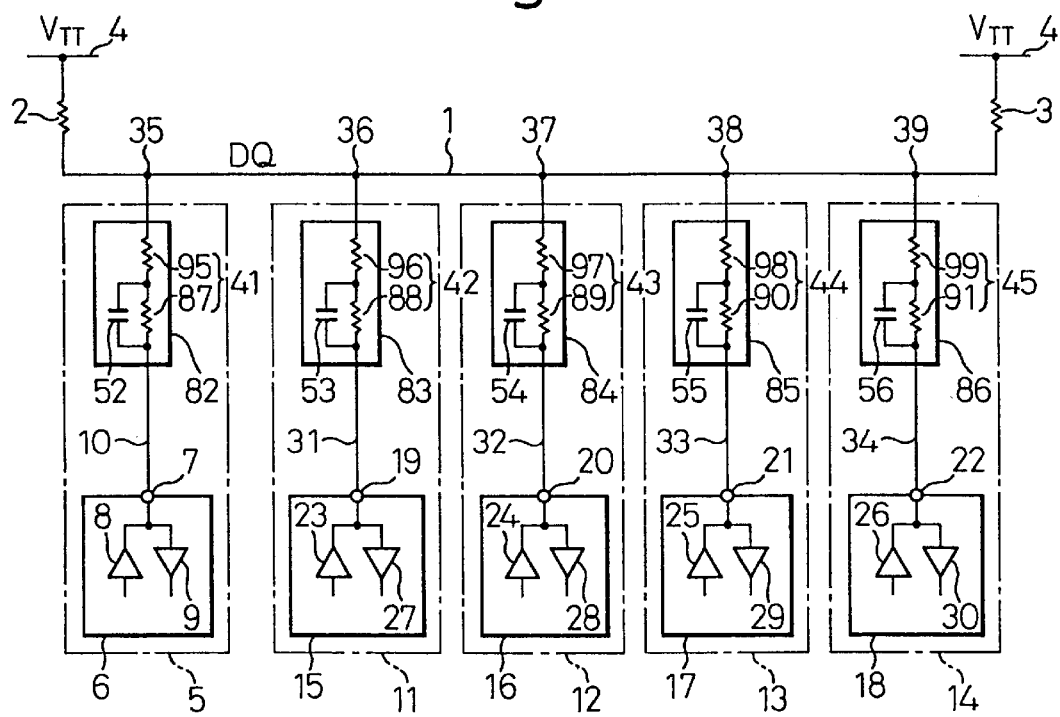
FIG. 18 is a circuit diagram showing an essential part of a seventh embodiment of the present invention.

FIG. 18 shows an essential part of the seventh embodiment of the present invention. This embodiment incorporates an impedance circuit 82 in a package 5, and the other parts thereof are the same as those of the third embodiment of FIG. 11.

Similar to the third embodiment, the seventh embodiment improves a transmission frequency and a transmission speed.

Further, an eighth embodiment of an electronic circuit apparatus according to the present invention will be explained with reference to FIG. 19.

Figure 19:
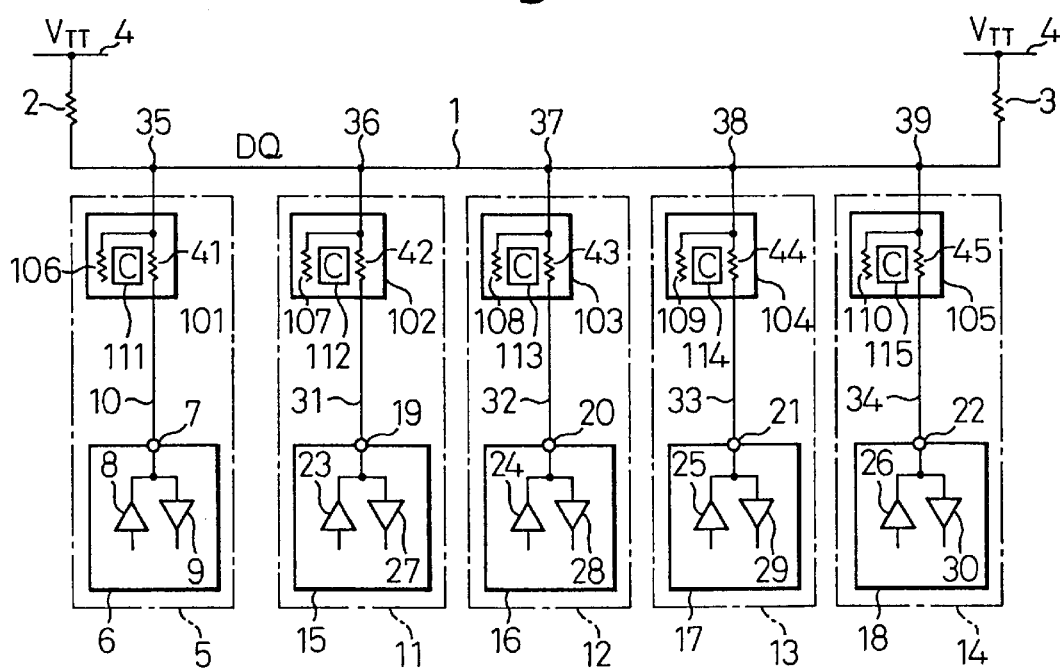
FIG. 19 is a circuit diagram showing an essential part of an eighth embodiment of the present invention.

FIG. 19 is a circuit diagram showing an essential part of the eighth embodiment of the present invention. This embodiment incorporates an impedance circuit 101 in a package 5, and the other parts thereof are the same as those of the fourth embodiment of FIG. 13.

Similar to the fourth embodiment, the eighth embodiment improves a transmission frequency and a transmission speed.

In addition, a ninth embodiment of an electronic circuit apparatus according to the present invention will be explained with reference to FIG. 20.

Figure 20:
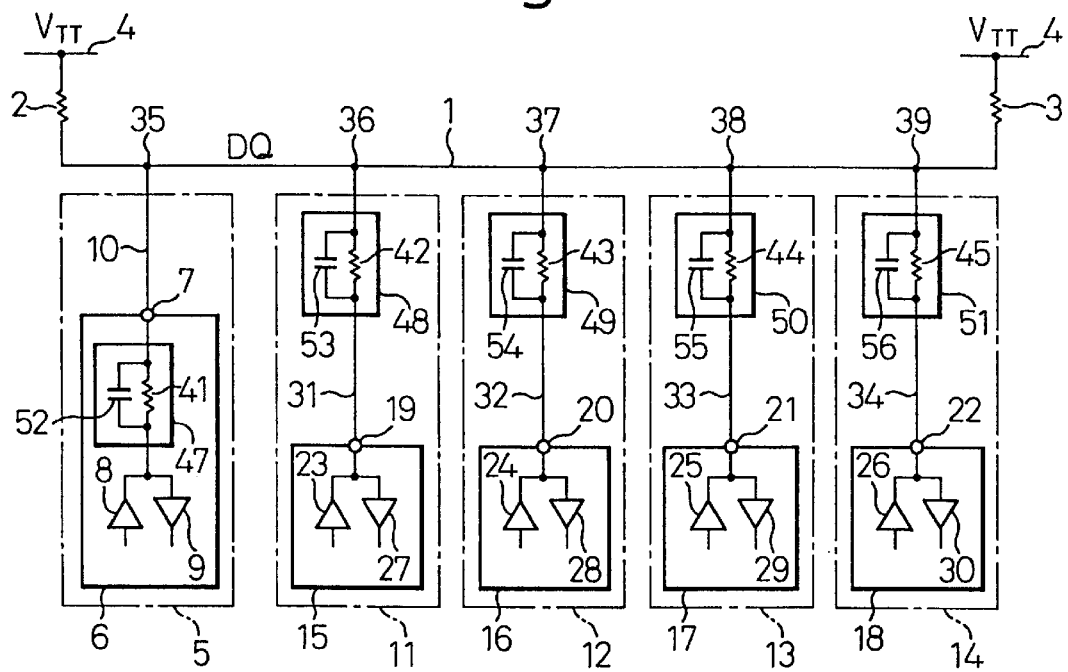
FIG. 20 is a circuit diagram showing an essential part of a ninth embodiment of the present invention.

FIG. 20 shows an essential part of the ninth embodiment of the present invention. The ninth embodiment installs an impedance circuit 47 on an MPU 6, and the other parts thereof are the same as those of the first embodiment.

According to the ninth embodiment, the impedance circuit 47 changes the waveform of an output signal of the MPU 6 and supplies it to the bus 1. In this case, an accelerated output signal instead of a rectangular output signal is supplied from the MPU 6 to the bus 1. This signal is changed into a rectangular signal at an input terminal of a destination.

Similar to the first embodiment, the ninth embodiment improves a transmission frequency and a transmission speed.

A tenth embodiment of an electronic circuit apparatus according to the present invention will be explained with reference to FIG. 21.

Figure 21:
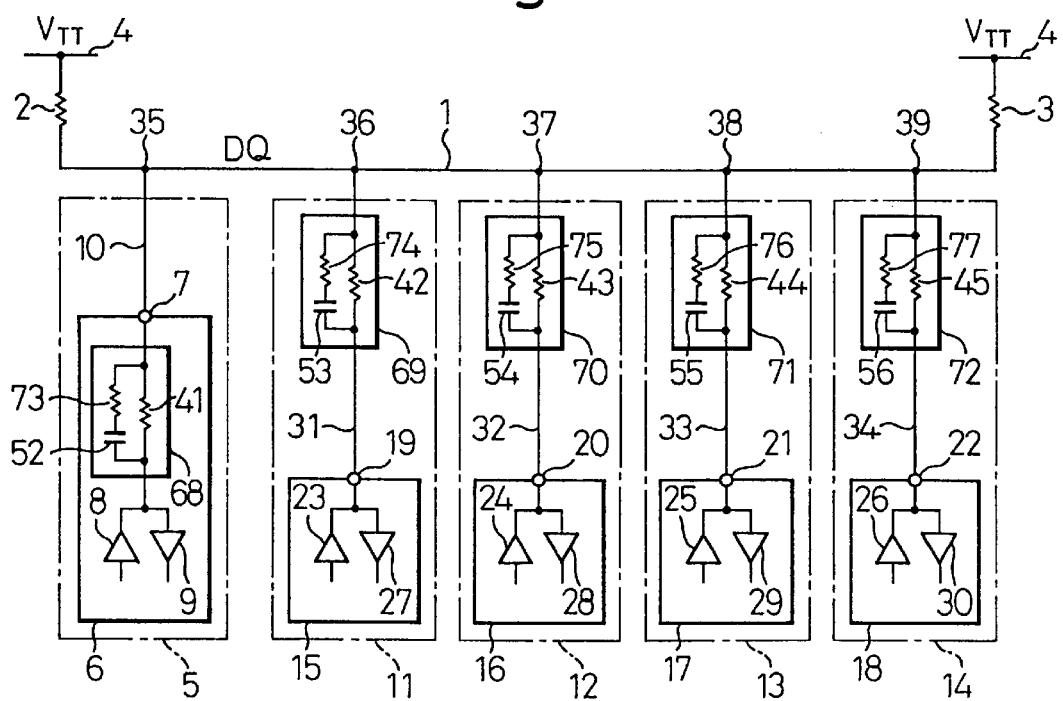
FIG. 21 is a circuit diagram showing an essential part of a tenth embodiment of the present invention.

FIG. 21 shows an essential part of the 10th embodiment of the present invention. The 10th embodiment installs an impedance circuit 68 on an MPU 6, and the other parts thereof are the same as those of the second embodiment of FIG. 8.

According to the 10th embodiment, the impedance circuit 68 changes the waveform of an output signal of the MPU 6 and supplies it to the bus 1. In this case, an accelerated output signal instead of a rectangular output signal is supplied from the MPU 6 to the bus 1. The signal is changed into a rectangular signal at an input terminal of a destination.

Similar to the second embodiment, the 10th embodiment improves a transmission frequency and a transmission speed.

Further, an eleventh embodiment of an electronic circuit apparatus according to the present invention will be explained with reference to FIG. 22.

Figure 22:
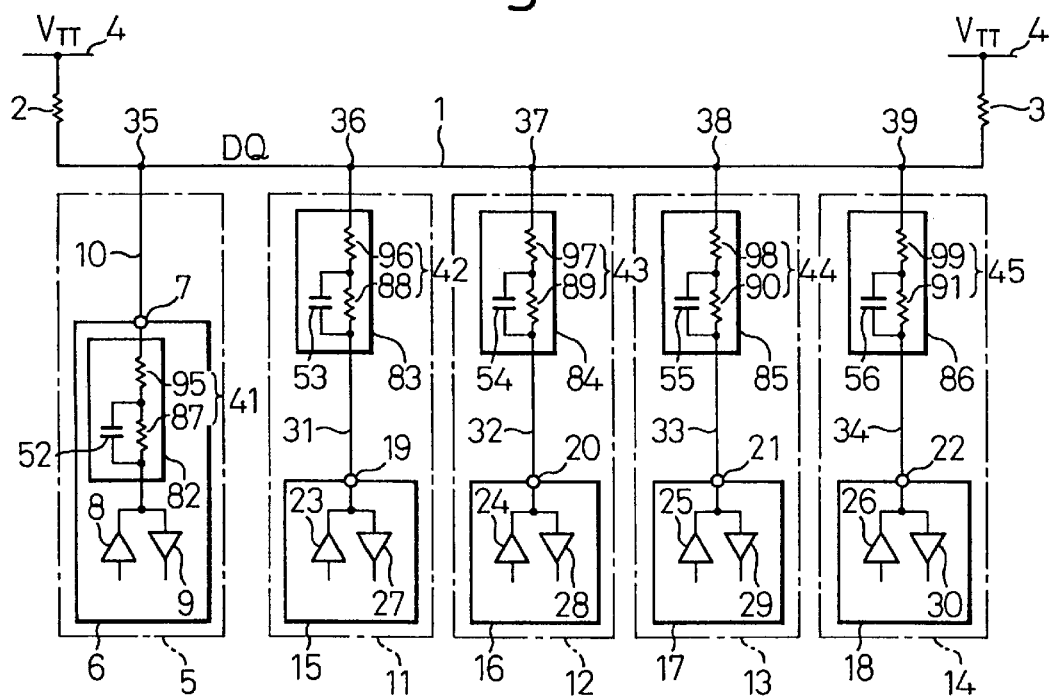
FIG. 22 is a circuit diagram showing an essential part of an eleventh embodiment of the present invention.

FIG. 22 shows an essential part of the 11th embodiment of the present invention. The 11th embodiment installs an impedance circuit 82 on an MPU 6, and the other parts thereof are the same as those of the third embodiment of FIG. 11. According to the 11th embodiment, the impedance circuit 82 changes the waveform of an output signal of the MPU 6 and supplies it to the bus 1. In this case, an accelerated output signal instead of a rectangular output signal is supplied from the MPU 6 to the bus 1. The signal is changed into a rectangular signal at an input terminal of a destination.

Similar to the third embodiment, the 11th embodiment improves a transmission frequency and a transmission speed.

Further, a twelfth embodiment of an electronic circuit apparatus according to the present invention will be explained with reference to FIG. 23.

Figure 23:
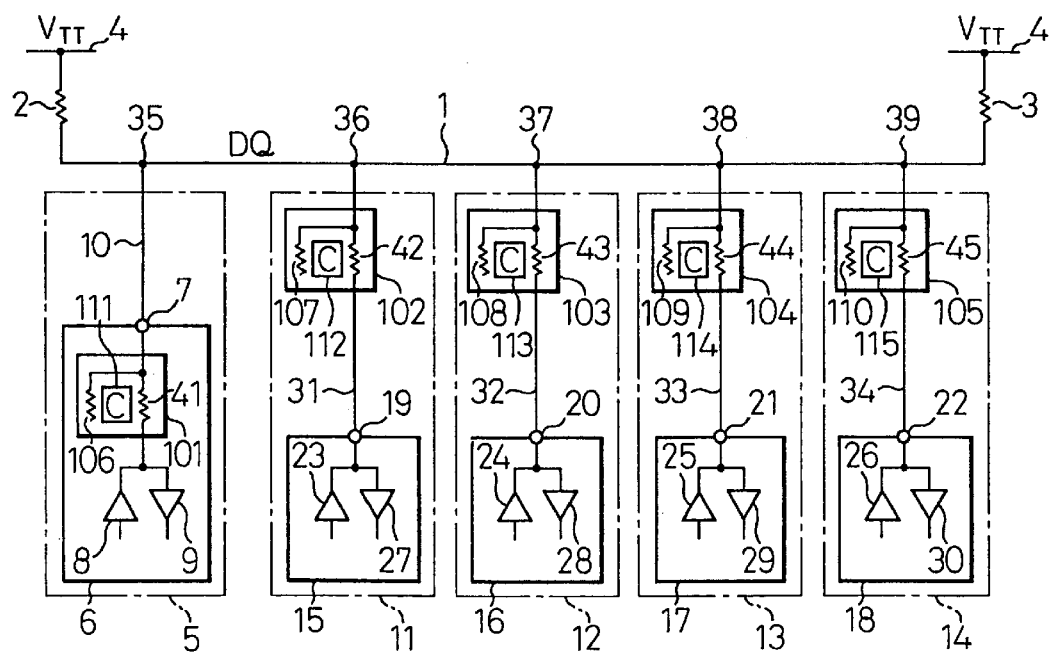
FIG. 23. is a circuit diagram showing an essential part of a twelfth embodiment of the present invention.

FIG. 23 shows an essential part of the 12th embodiment of the present invention. The 12th embodiment installs an impedance circuit 101 on an MPU 6, and the other parts thereof are the same as those of the fourth embodiment of FIG. 13.

According to the 12th embodiment, the impedance circuit 101 changes the waveform of an output signal of the MPU 6 and supplies it to the bus 1. In this case, an accelerated output signal instead of a rectangular output signal is supplied from the MPU 6 to the bus 1. The signal is changed into a rectangular signal at an input terminal of a destination.

Similar to the fourth embodiment, the 12th embodiment improves a transmission frequency and a transmission speed.

In addition, a thirteenth embodiment of an electronic circuit apparatus according to the present invention will be explained with reference to FIG. 24.

Figure 24:
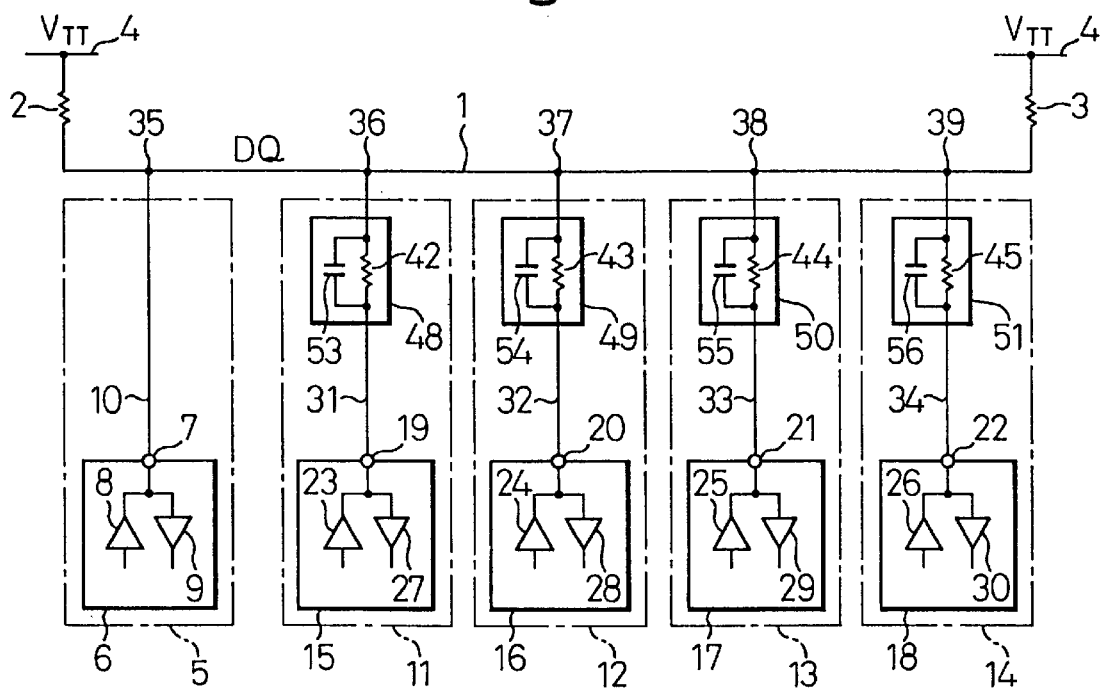
FIG. 24 is a circuit diagram showing an essential part of a thirteenth embodiment of the present invention.

FIG. 24 shows an essential part of the 13th embodiment of the present invention. The 13th embodiment directly connects a stub 10 to a bus 1 instead of installing the impedance circuit 47 of the first embodiment of FIG. 4. The other parts thereof are the same as those of the first embodiment.

The 13th embodiment is capable of improving a transmission frequency and a transmission speed similar to the first embodiment if the length of the stub 10 is equal to or shorter than 3 cm. This means that the first embodiment is effective when the length of the stub 10 is longer than 3 cm.

A fourteenth embodiment of an electronic circuit apparatus according to the present invention will be explained with reference to FIG. 25.

Figure 25:
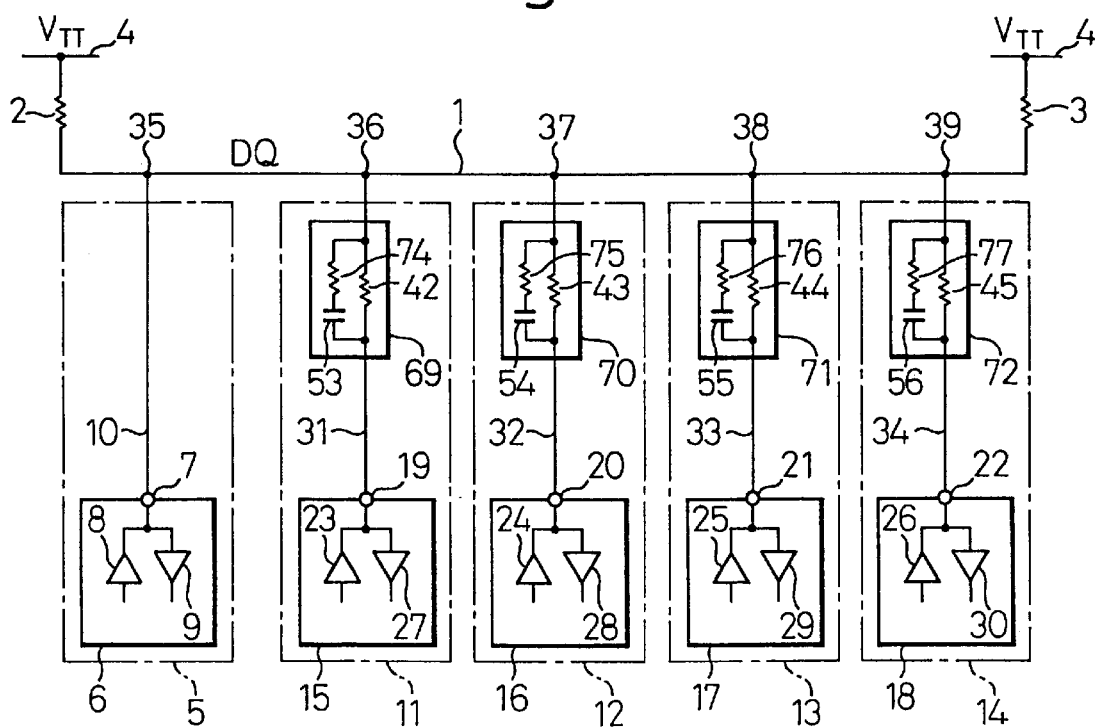
FIG. 25 is a circuit diagram showing an essential part of a fourth embodiment of the present invention.

FIG. 25 shows an essential part of the 14th embodiment of the present invention. The 14th embodiment directly connects a stub 10 to a bus 1 instead of installing the impedance circuit 68 of the second embodiment of FIG. 8. The other parts thereof are the same as those of the second embodiment.

The 14th embodiment is capable of improving a transmission frequency and a transmission speed similar to the second embodiment if the length of the stub 10 is equal to or shorter than 3 cm. This means that the second embodiment is effective when the length of the stub 10 is longer than 3 cm.

Further, a fifteenth embodiment of an electronic circuit apparatus according to the present invention will be explained with reference to FIG. 26.

Figure 26:
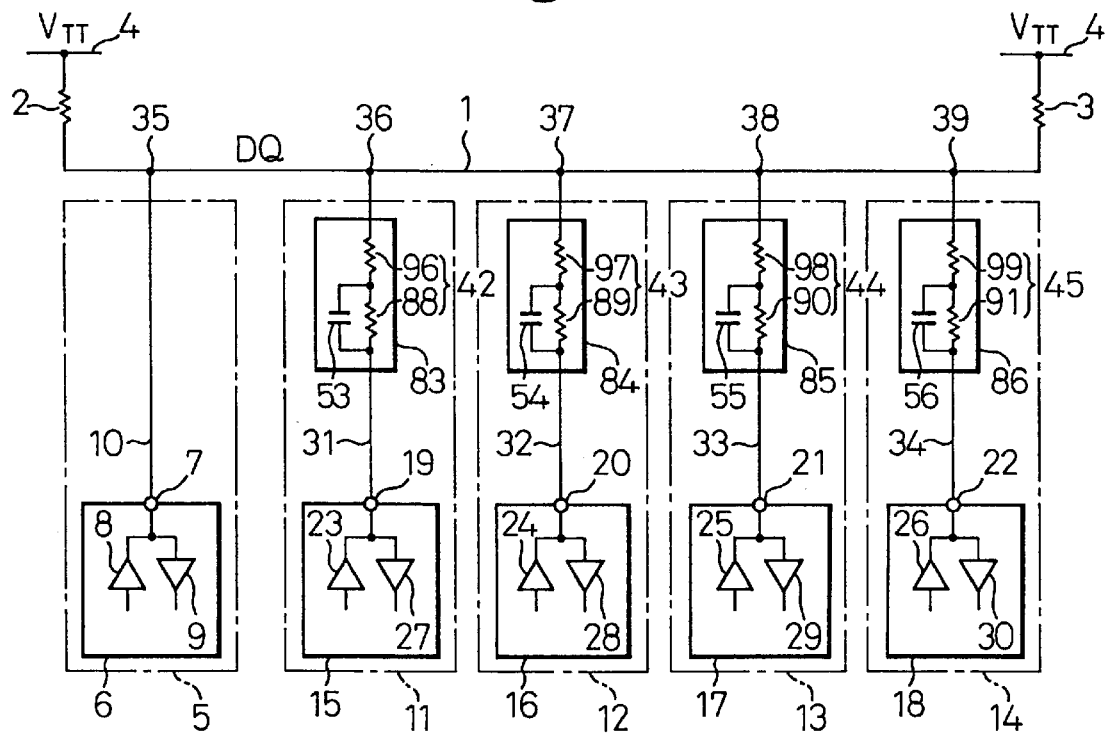
FIG. 26 is a circuit diagram showing an essential part of a fifteenth embodiment of the present invention.

FIG. 26 shows an essential part of the 15th embodiment of the present invention. The 15th embodiment directly connects a stub 10 to a bus 1 instead of installing the impedance circuit 82 of the third embodiment of FIG. 11. The other parts thereof are the same as those of the third embodiment.

The 15th embodiment is capable of improving a transmission frequency and a transmission speed similar to the third embodiment if the length of the stub 10 is equal to or shorter than 3 cm. This means that the third embodiment is effective when the length of the stub 10 is longer than 3 cm.

Further, a sixteenth embodiment of an electronic circuit apparatus according to the present invention will be explained with reference to FIG. 27.

Figure 27:
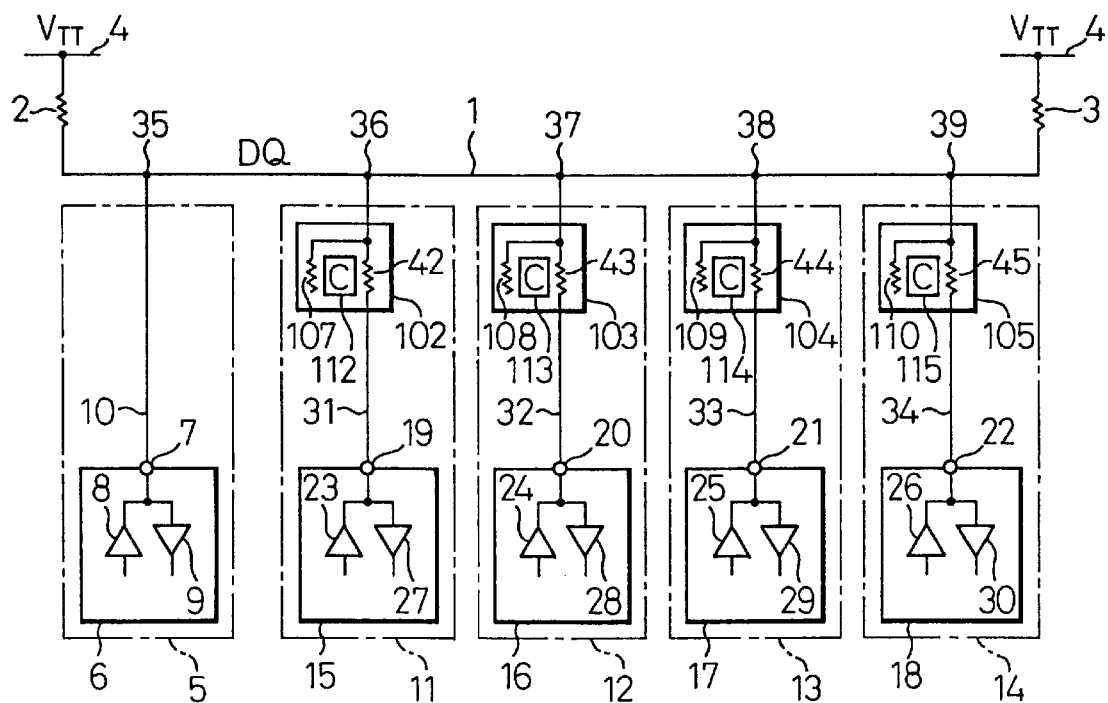
FIG. 27 is a circuit diagram showing an essential part of a sixteenth embodiment of the present invention.

FIG. 27 is a circuit diagram showing an essential part of the 16th embodiment of the present invention. The 16th embodiment directly connects a stub 10 to a bus 1 instead of installing the impedance circuit 101 of the fourth embodiment of FIG. 13. The other parts thereof are the same as those of the fourth embodiment.

The 16th embodiment is capable of improving a transmission frequency and a transmission speed similar to the fourth embodiment if the length of the stub 10 is equal to or shorter than 3 cm. This means that the fourth embodiment is effective when the length of the stub 10 is longer than 3 cm.

Application of impedance element of, for example, FIG. 5 will be explained.

FIG. 28A shows an application of the impedance element shown in FIGS. 5, 9, 12, and 15. In FIG. 28A, reference numeral 117 is an address (ADD) bus formed on a mother board. In FIG. 28A, reference numeral 118 is a driver arranged in a memory unit (memory module) 11, and 119 is the impedance element (IE) shown in FIGS. 5, 9, 12, and 15 installed in the memory unit 11.

Further, reference numeral 120 is an address signal line formed in the memory unit 11, and 15 and 121 to 123 are SDRAMs arranged on the memory unit 11. The address signal line 120 needs a resistor for suppressing a ringing but an element having a high-pass filter characteristic is not necessarily needed.

The first to 16th embodiments employ the impedance element for a data signal stub. This impedance element may be used as a ringing suppress element for the address signal line 120. This may simplify parts management and manufacturing processes and reduce the cost.

As explained above, the present invention connects an impedance circuit between a bus and a stub that must prevent a ringing. The impedance circuit has a series connected resistor and provides a high-pass filter characteristic. The present invention suppresses the ringing, prevents an attenuation in the high-frequency components of a transmission signal, maintains the sharpness of the signal, and improves a transmission frequency and a transmission speed.

Figure 28B:
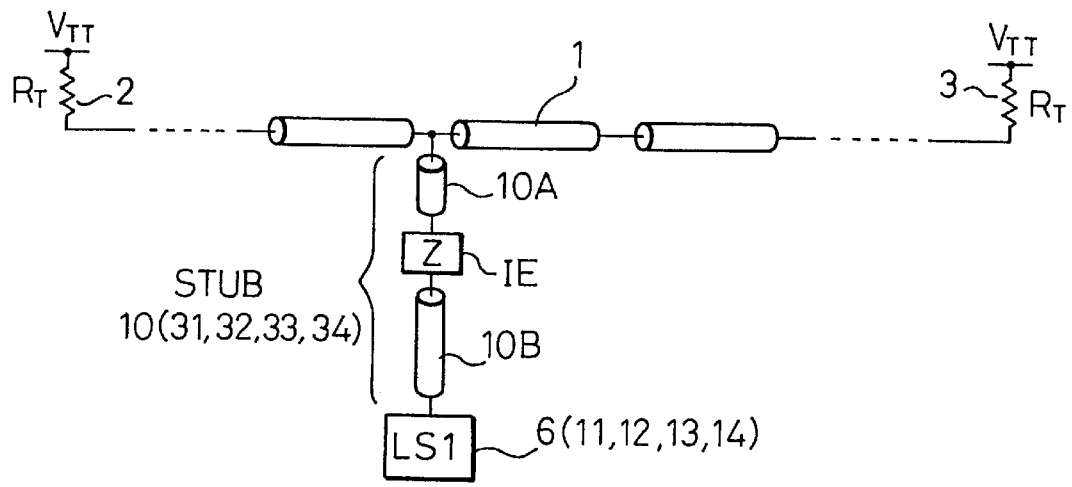
FIGS. 28B and 28C are diagrams for explaining the preferred configuration of the present invention.
Figure 28C:
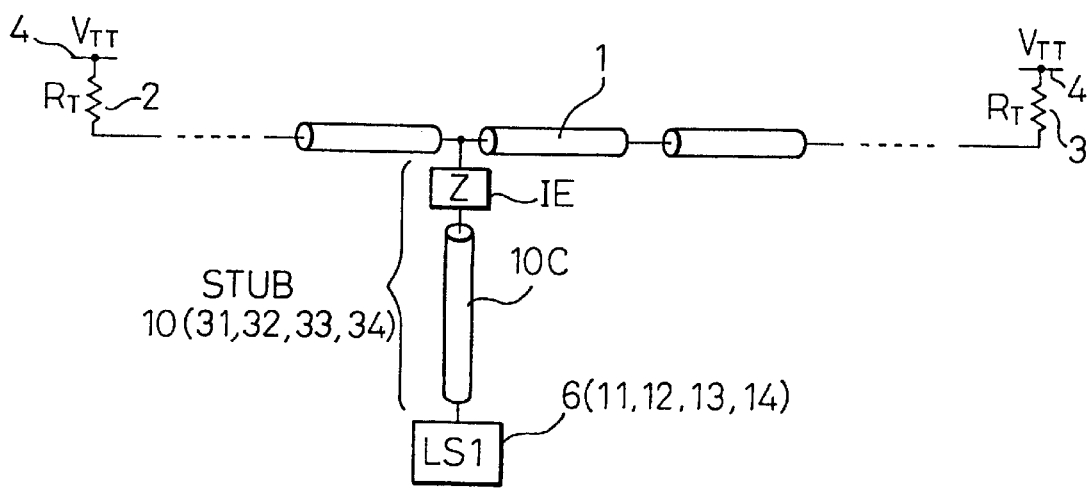

FIGS. 28B and 28C are diagrams for explaining the preferred configuration of the present invention (first aspect of the present invention. Note that the configuration shown in FIG. 28B is not preferable, but the configuration shown in FIG. 28C is preferable.

Namely, as shown in FIG. 28B, in the stub 10 (31, 32, 33, 34), the impedance element IE is connected to the bus 1 through an extended line 10A (a part of the stub 10). That is, in the configuration of FIG. 28B, the impedance element IE is provided between lines 10A and 10B, and the length of the line 10A is considerably long, and thus an impedance matching between the stub 10 and the bus 1 cannot be sufficiently improved by the impedance element IE. Consequently, part of the signal transmitted through the bus 1 and the stub 10 is reflected and a ringing in the stub 10 may be caused.

On the other hand, as shown in FIG. 28C, in the stub 10 (31, 32, 33, 34), the impedance element IE is directly or closely connected to the bus 1. That is, in the configuration of FIG. 28C, the extended line (10A) is not existed, or the line 10C is much longer than the line 10B shown in FIG. 28B, and thus an impedance matching between the stub 10 and the bus 1 can be sufficiently improved by the impedance element IE. Namely, in the present invention (first aspect of the present invention), as shown in FIG. 28C, the impedance element IE is preferably provided close to the bus (main bus) 1.

Note that, the impedance element IE is, for example, shown in FIGS. 5, 9, 12, and 15. Further, the LSI 6 (11, 12, 13, 14) is, for example, a CPU, a memory controller, a semiconductor memory, or a various electronic circuit.

Figure 29A:
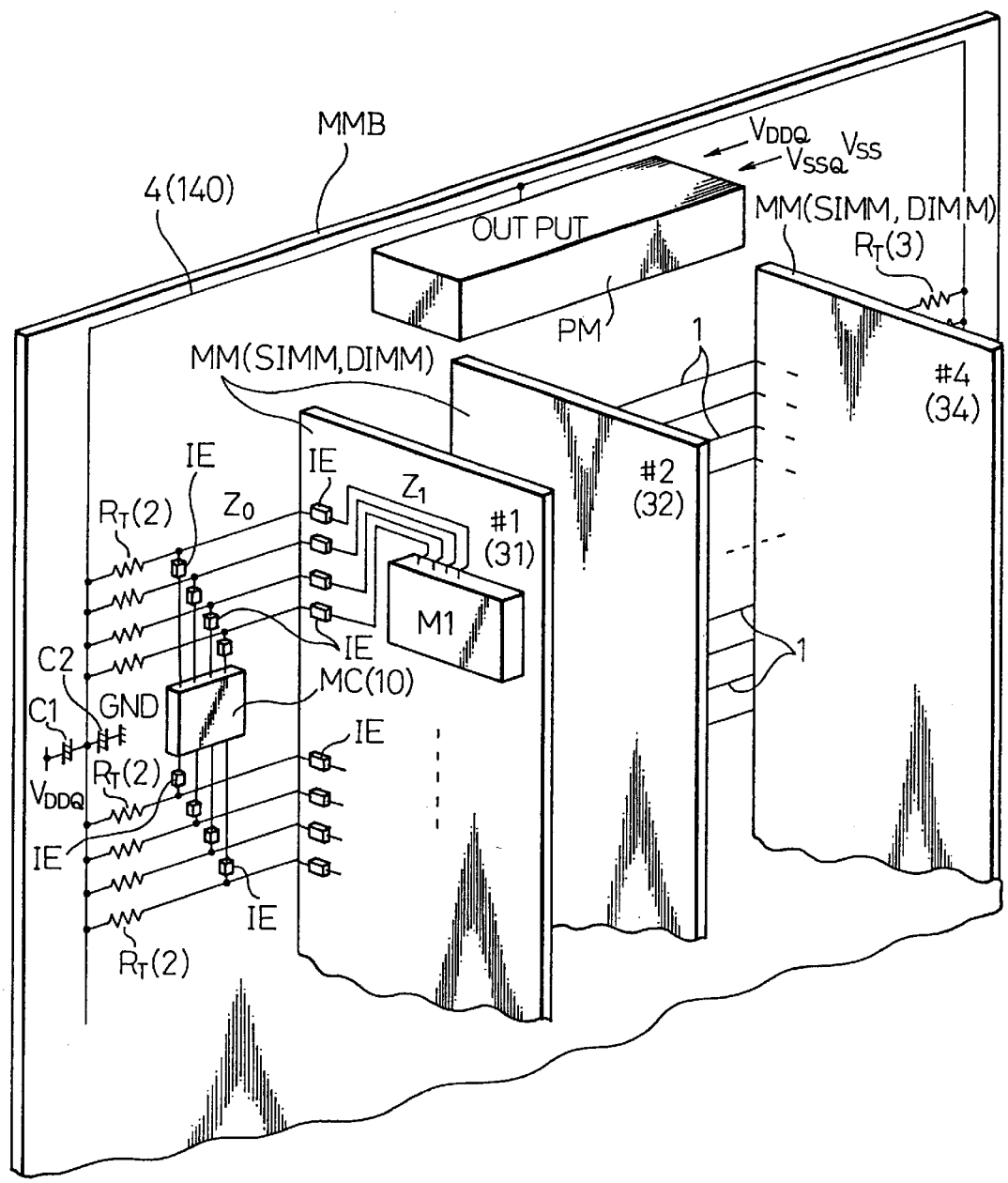
FIG. 29A is a perspective diagram showing a mother memory board including a plurality of memory modules according to the present invention.
Figure 29B:
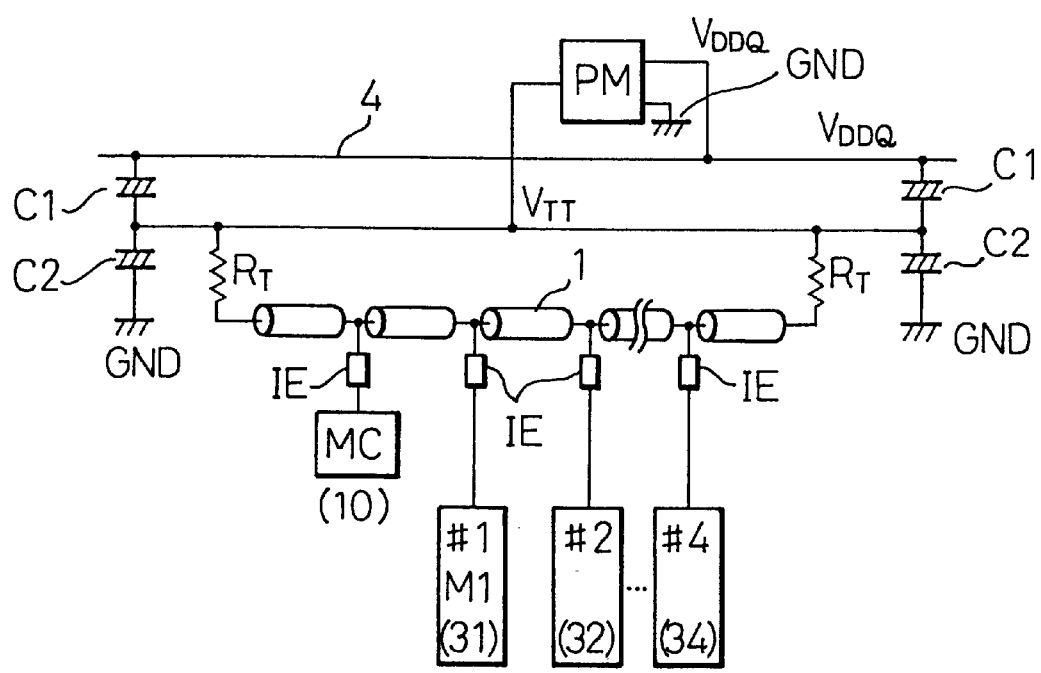
FIG. 29B is a circuit diagram schematically showing a power source system of the mother memory board of FIG. 29A.

FIG. 29A shows a mother memory board according to the present invention, and FIG. 29B schematically shows a power source system of the mother memory board of FIG. 29A.

In FIGS. 29A and 29B, reference PM is a power module, MM is a memory module (SIMM or DIMM), MMB is a mother memory board including a plurality of memory modules MM, and MC is a memory control unit. As shown in FIG. 29A, each of the memory modules MM (#1 to #4, or 31 to 34) is connected without providing a connector, or directly soldered on the mother memory board MMB. In this case, a plurality of impedance elements IE are provided on each of the memory modules MM and close to the bus 1.

The power module PM receives voltages VDDQ, VSSQ, Vss, and generate a terminal voltage VTT to the terminal voltage supplying line 140. The memory control unit MC is used to control or manage the operations of the memory modules MM.

As shown in FIGS. 29A and 29B, each bus 1 is connected to a terminal voltage supplying line 4 (140) through terminating resistors RT (2, 3). Further, the terminal voltage supplying line 140 is connected to a high potential power supply line (VDDQ) through a first stabilizing capacitor C1 and a low power power supply line (GND) through a second stabilizing capacitor C2. Note that the first and second stabilizing capacitors C1, C2 are provided at both ends of the terminal voltage supplying line 140, and each end of the bus 1 is connected to an intermediate connection portion between the first and second stabilizing capacitors C1, C2 through the corresponding terminating resistor 2, 3, respectively.

Note that the first and second stabilizing capacitors C1, C2 are used to stabilize the potential at the terminal voltage supplying line 140, even though a large current is flowing through optional one memory module MM (or optional one semiconductor memory M1). For example, the capacitance value of the stabilizing capacitor (C1, C2) is determined to several hundreds or several thousands microfarads ($\mu F$).

Figure 30A:
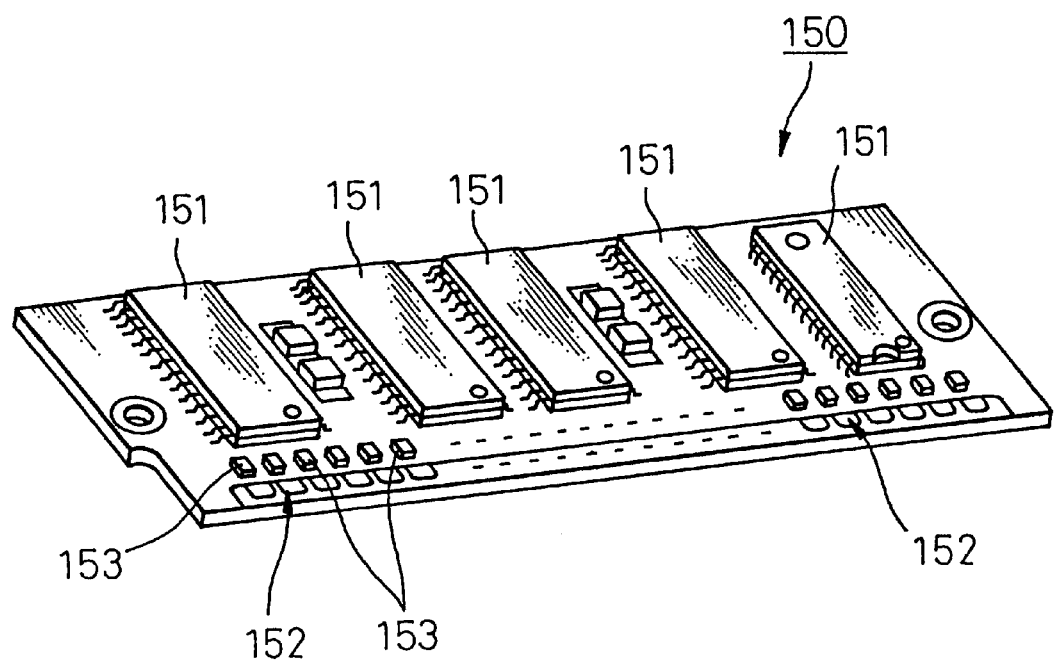
FIG. 30A is a perspective diagram showing a single in-line memory module (SIMM) employing the impedance elements.

FIG. 30A shows a single in-line memory module employing the impedance elements. In FIG. 30A, reference numeral 150 is a single in-line memory module (SIMM), 151 is a semiconductor memory (for example, DRAM, SRAM, SDRAM, and the like), 152 is a connection portion for electrically connecting to the mother board through a connector, and 153 is an impedance element (IE: with reference to FIGS. 5, 9, 12, and 15).

As shown in FIG. 30A, the memory module 150 has a plurality of semiconductor memories 151, and a plurality of impedance elements 153 (IE) are provided on each of the memory modules 150 (MM) and close to the corresponding connection portions 152, or the bus (1) through the connector. Note that a dual in-line memory module (DIMM) can be also constituted similar to the above described SIMM (150). In this case (DIMM), a plurality of impedance elements 153 (IE) are provided at both side of the memory modules and close to the corresponding connection portions (152).

Further, in the embodiment of FIG. 30A, the impedance elements 153 may not be provided for all lines, or all of the connection portions 152, but the impedance elements 153 can be provided only for some lines, or optional some connection portions 152.

Figure 30B:
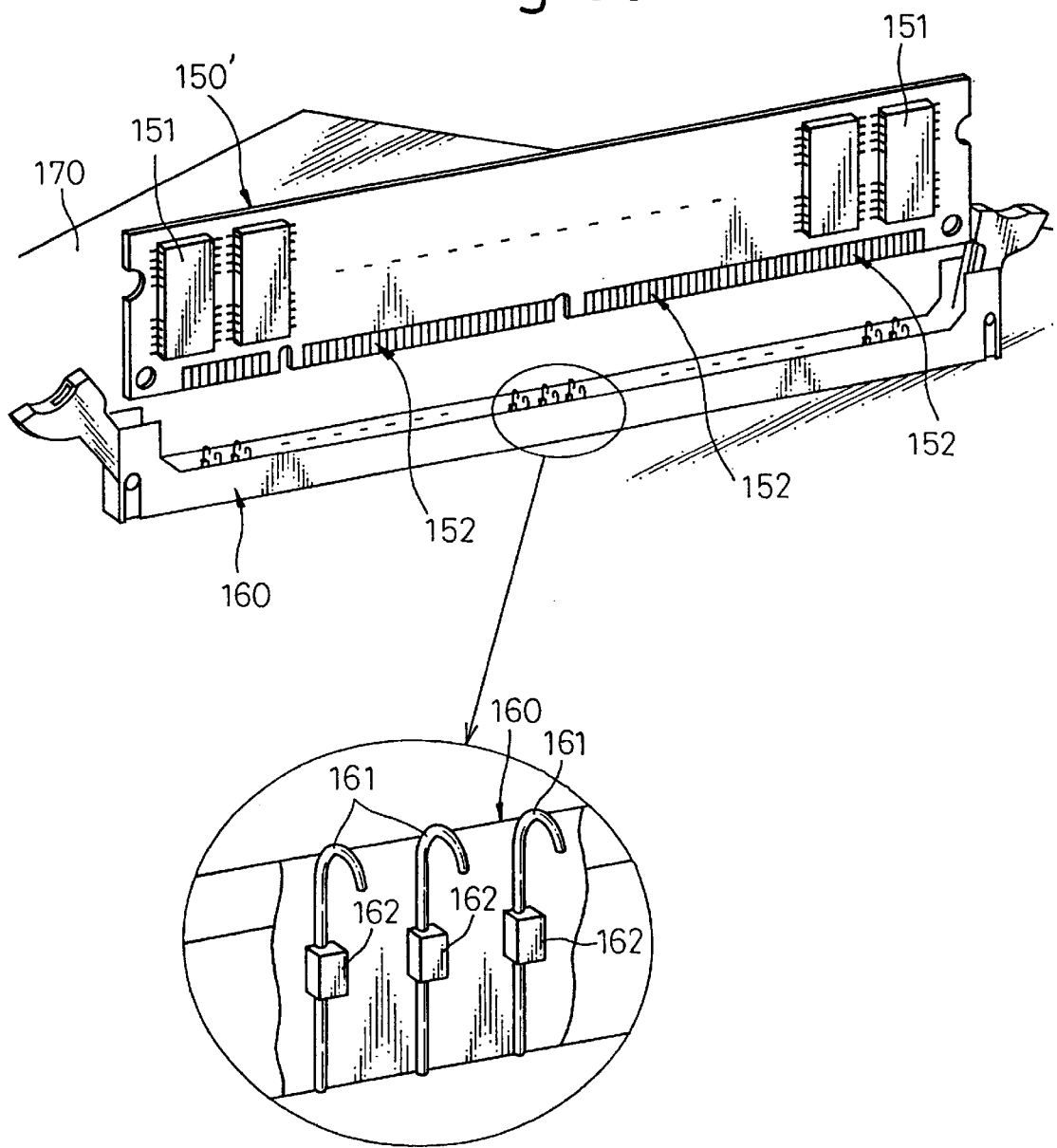
FIG. 30B is a perspective diagram showing a connector employing the impedance elements and a dual in-line memory module (DIMM)

FIG. 30B shows a connector 160 employing the impedance elements and a dual in-line memory module (DIMM) 150'. In FIG. 30B, reference numeral 161 is a connecting pin, 162 is an impedance element (IE), and 170 is a mother board including the connector 160. Note that the memory module (DIMM) 150' has a plurality of connection portions 152 at both sides of the memory module 150', and the connector 160 for DIMM has a plurality of connection pins 161 at the both sides of the connector 160 corresponding to the connection portions 152 of the memory module 150'. Further, in an enlarged perspective views of FIG. 30B, the described connector pins 161 are connected to the connection portions (152) at the hidden side (not shown in FIG. 30B) of the memory module 150'.

As shown in FIG. 30B, the impedance element is not provided on the memory module such as that shown in FIG. 30A, but a plurality of impedance elements 162 are provided in the connector 160. Namely, the impedance element 162 is inserted in the connecting pin 161. Note that one end (bending portion) of each connecting pin 161 is connected to the connection portion 152 of the memory module 150, and the other end of each connecting pin 161 is operatively connected to the semiconductor memory 151, and the like.

According to the embodiment shown in FIG. 30B, a general memory module not having impedance elements (162) can be used. In the above embodiment of FIG. 30B, a connector for SIMM can be also constituted similar to the above described connector 160 for DIMM (150'). In this case, a plurality of impedance elements 162 (IE) may be provided at one side of the connector. Further, in the embodiment of FIG. 30B, the impedance elements 162 may not be provided for all connecting pins 161, or all of the connection portions 152, but the impedance elements 162 can be provided only for some connecting pins 161, or optional some connection portions 152.

Below, a semiconductor device for generating a predetermined stable voltage according to the present invention (second aspect of the present invention) will be explained, with reference to accompanying drawings.

First, problems of the semiconductor devices according to the prior art or related art will be explained, with reference to FIGS. 31A through 33B.

Recently, semiconductor equipment such as portable computers and portable communication equipment are required to be compact and operate at a high speed and low power consumption. To meet these requirements, semiconductor circuits operating with a high-speed clock signal and a low source voltage have been developed. To secure an accurate operation with the high-speed clock signal and low source voltage, the semiconductor circuits need, in addition to source voltages Vcc (for example, 3.3V) and Vss (a ground level of, for example, 0V), a voltage (Vref) of, for example, ½ of Vcc.

Figure 31A:
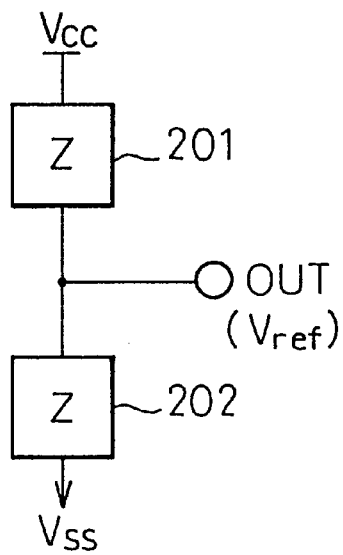
FIGS. 31A and 31B are diagrams showing semiconductor circuits according to the prior art.
Figure 31B:
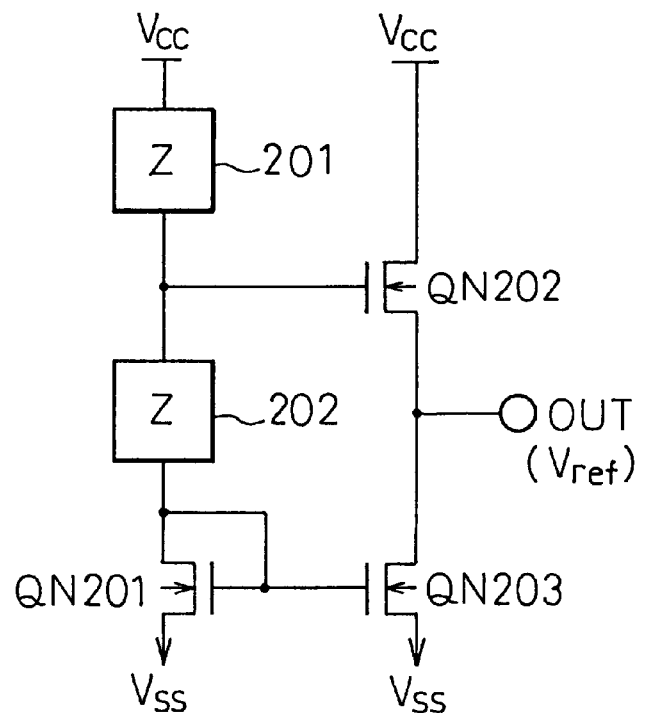

FIGS. 31A and 31B show semiconductor circuits according to the prior art. Each of these circuits generates a cell plate voltage for a DRAM, a reference voltage applied to a data bus between chips, or a reference voltage used to differentially amplify an input signal in a receiver chip. The circuits of FIGS. 31A and 31B include a high potential power source Vcc for providing, for example, 3.3V, a low potential power source (GND) for providing, for example, 0V, resistors (impedance elements) 201 and 202, and n-channel MOS transistors QN201, QN202, and QN203.

In FIG. 31A, the resistors 201 and 202 are connected in series between the power sources Vcc and Vss, and a node OUT between the resistors 201 and 202 provides an output voltage (a reference voltage) Vref that is different from the voltages Vcc and Vss. The reference voltage Vref is, for example, ½ of Vcc.

In FIG. 31B, the resistors 201 and 202 and n-channel MOS transistor QN201 are connected in series between the power sources Vcc and Vss. The n-channel MOS transistors QN202 and QN203 are connected in series between the power sources Vcc and Vss. A node between the resistors 201 and 202 is connected to the gate of the transistor QN202. The gate and drain of the transistor QN201 are connected to the gate of the transistor QN203.

In this way, the prior arts employ the resistors to divide the source voltages Vcc and Vss, to generate a bias voltage such as the reference voltage Vref of ½ of Vcc, which is different from the source voltages Vcc and Vss. The generated voltage is used as a cell plate voltage for a DRAM or a reference voltage for a small-amplitude I/O device.

Figure 32:
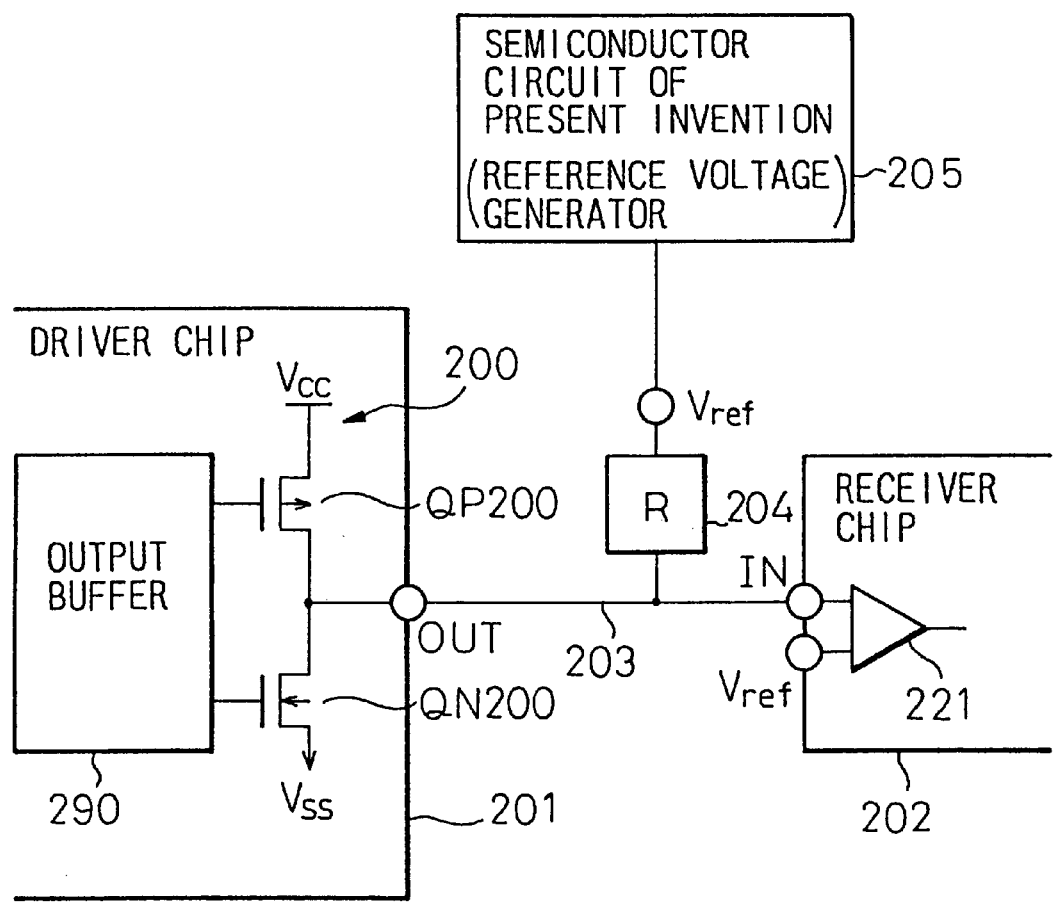
FIG. 32 is a diagram showing chips and a bus employing the semiconductor circuit of FIGS. 31A and 31B.

FIG. 32 shows a bus between chips and a terminal power source of a small-amplitude I/O device. In this figure, a reference voltage generator 205 is any one of the semiconductor circuits shown in FIGS. 31A and 31B to generate a reference voltage Vref. The reference voltage Vref is used to shape the waveform of a signal provided by a push-pull circuit 200 to a data bus 203, to thereby correctly transfer data. The push-pull circuit 200 is arranged after an output buffer 290.

The arrangement of FIG. 32 includes a driver chip 201, a receiver chip 202, a differential amplifier 221, the data bus 203, a terminating resistor 204, the reference voltage generator 205, the push-pull circuit 200, and the output buffer 290.

The driver chip 201 sends data to the receiver chip 202 through the data bus 203. The data bus 203 is driven by the push-pull circuit 200, which consists of a p-channel MOS transistor QP200 and an n-channel MOS transistor QN200. These transistors are controlled by the output buffer 290. There reference voltage Vref from the reference voltage generator 205 is applied to the data bus 203 through the terminating resistor 204. Accordingly, the level of the data bus 203 is kept at the reference voltage Vref under a steady state in which no data is transferred. In the receiver chip 202, an input signal IN is supplied to the differential amplifier 221, which amplifies the difference between the input signal IN and the reference voltage Vref.

The semiconductor circuit of the prior art of FIG. 31A must supply a large current to the resistors 201 and 202 to stabilize the reference voltage Vref. Namely, this prior art must supply a large direct current to decrease an output impedance, thereby causing a power consumption problem.

The semiconductor circuit of the prior art of FIG. 31B shows a low output impedance in a pull-down state to supply a current from the transistor QN202 to the output OUT. An output impedance in a pull-up state to draw a current from the output OUT through the transistor QN203, however, is not sufficiently low. Namely, it is difficult to pass a large current through the transistor QN203, and it is hard to sufficiently stabilize the reference voltage Vref from the output OUT.

When the reference voltage generator 205 of FIG. 32 is the semiconductor circuit of FIG. 31B, the reference voltage generator 205 receives a current from the terminating resistor 204 in a pull-up state and provides a current to the terminating resistor 204 in a pull-down state. In both the states, the output voltage Vref must be stable. If is difficult, however, for the circuit of FIG. 31B to stabilize the reference voltage Vref in both the cases.

The reference voltage Vref generated by the reference voltage generator mentioned above is supplied to the differential amplifier 221 of the receiver chip 202, or is used as a cell plate voltage for a DRAM. The semiconductor circuit mentioned above is also applicable to an input buffer circuit or a logic gate having a threshold.

Figure 33A:
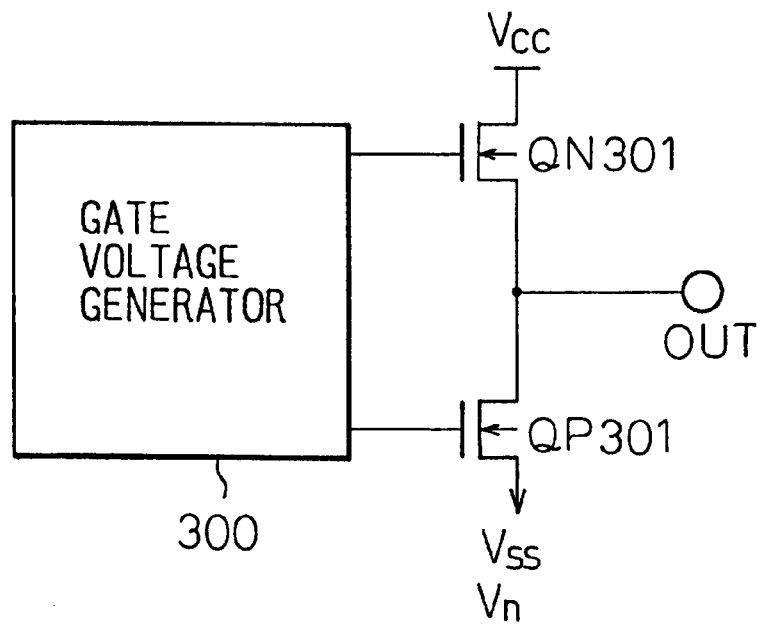
FIGS. 33A and 33B are diagrams showing semiconductor circuits according to related arts.
Figure 33B:
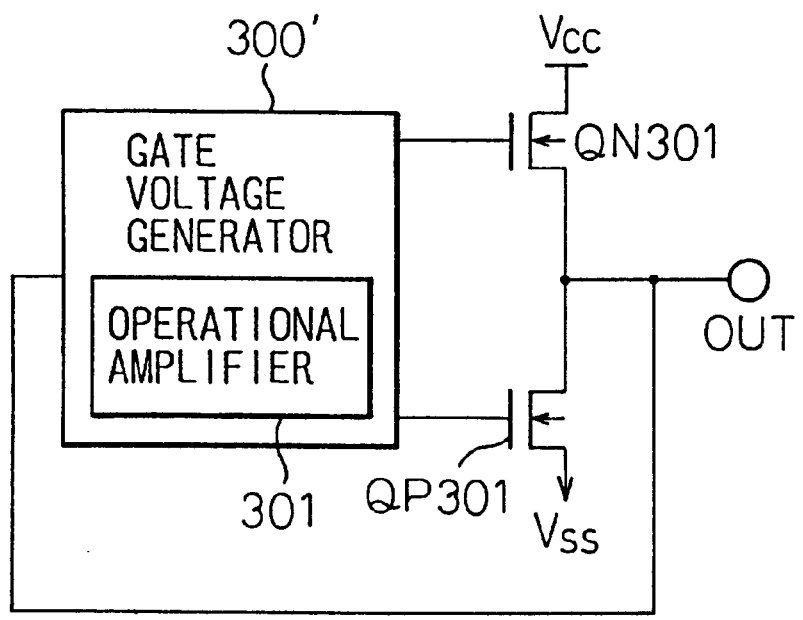

FIGS. 33A and 33B show block diagrams of semiconductor circuits according to related arts. To stabilize an output voltage, i.e., a reference voltage, these circuits employ a p-channel MOS transistor QP301, an n-channel MOS transistor QN301, and a gate voltage generator 300 or 300'.

In FIGS. 33A and 33B, the n-channel MOS transistor QN301 and p-channel MOS transistor QP301 are connected in series between power source Vcc and Vss, to generate a stable output voltage. The transistors QN301 and QP301 are controlled by the gate voltage generator 300 or 300'.

The gate voltage generator 300 of the semiconductor circuit of FIG. 33A has a complicated structure to provide a signal to the gates of the transistors QN301 and QP301. To solve this problem, the gate voltage generator 300' of FIG. 33B employs an analog operational amplifier 301 to form a feedback circuit to detect a fluctuation in an output voltage.

It is required to provide a simple semiconductor device to generate an output voltage at low power consumption. To solve the problems of the semiconductor circuits of the prior arts, an object of the present invention is to provide a semiconductor circuit realizing a small output impedance at low power consumption.

Next, semiconductor circuits according to embodiments of the present invention (second aspect of the present invention) will be explained with reference to accompanying drawings.

FIGS. 34A to 34E shows semiconductor circuits according to first to fifth embodiments of the second aspect of the present invention. Through these figures, a reference mark Vcc is a high potential power source of, for example, 3.3V, Vss is a low potential power source (GND) of, for example, 0V, QP1, QP2, QP11, QP12, QP21, and QP22 are p-channel MOS transistors, and QN1, QN2, QN11, QN12, QN21, and QN22 are n-channel MOS transistors.

Figures 34A, 34B, 34C:
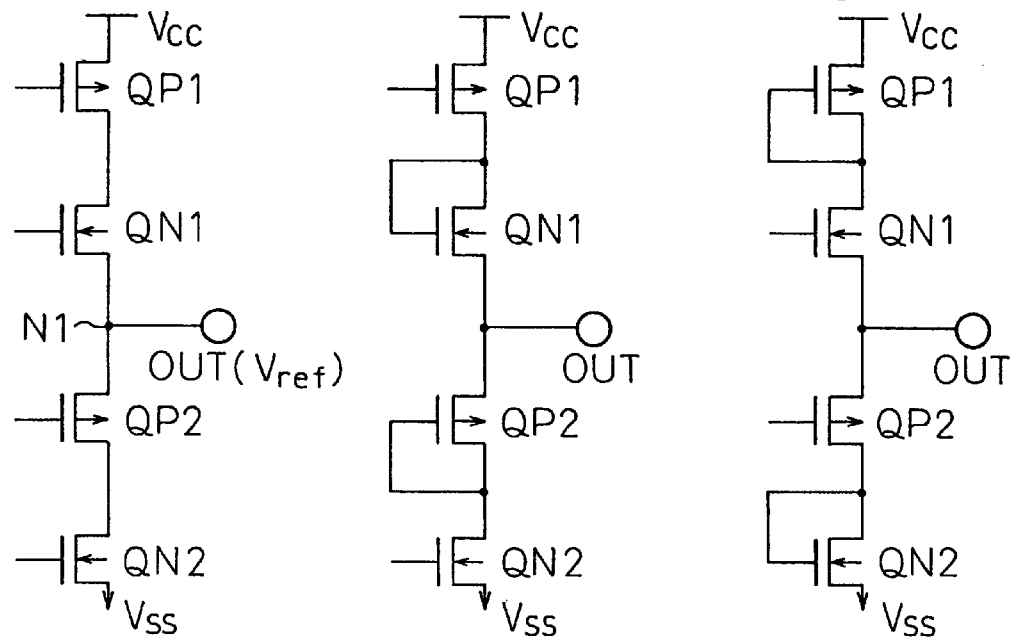
FIGS. 34A to 34E are diagrams showing semiconductor circuits according to embodiments of the present invention (part 1)

In the first embodiment of FIG. 34A, the p-channel MOS transistors QP1 and QP2 and the n-channel MOS transistors QN1 and QN2 are connected in series between the high and low potential power sources Vcc and Vss. The source of the transistor QP1 is connected to the high potential power source Vcc, and the drain thereof is connected to the drain of the transistor QN1. The source of the transistor QN1 is connected to the source of the transistor QP2 through a node N1. The drain of the transistor QP2 is connected to the drain of the transistor QN2, and the source of the transistor QN2 is connected to the low potential power source Vss. The node N1 between the transistors QN1 and QP2 provides an output voltage OUT, which may be a reference voltage Vref of, for example, ½ of Vcc.

In the second embodiment of FIG. 34B, the gate and drain of the transistor QN1 are connected to each other, and the source and gate of the transistor QP2 are connected to each other. Namely, the transistors QN1 and QP2 form diodes, respectively.

In the third embodiment of FIG. 34C, the source and gate of the transistor QP1 are connected to each other, and the drain and gate of the transistor QN2 are connected to each other. Namely, the transistors QP1 and QN2 form diodes, respectively.

Figures 34D, 34E:
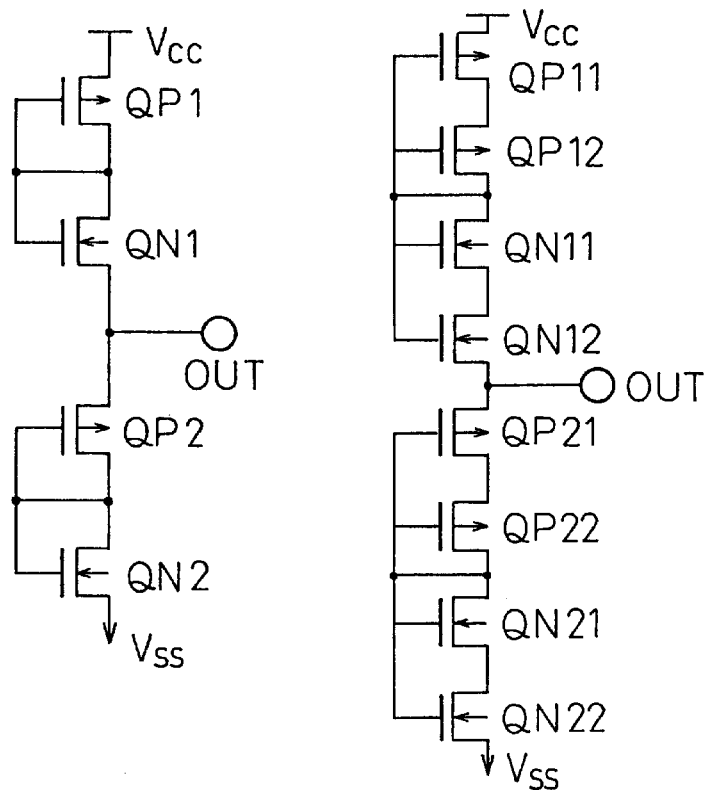

The fourth embodiment of FIG. 34D is a combination of the embodiments of FIGS. 34B and 34C. The source and gate of the transistor QP1 are connected to each other, the gate and drain of the transistor QN1 are connected to each other, the source and gate of the transistor QP2 are connected to each other, and the drain and gate of the transistor QN2 are connected to each other. The transistors QP1, QP2, QN1, and QN2 form diodes, respectively.

In the fifth embodiment of FIG. 34E, each of the transistors QP1, QP2, QN1, and QN2 of the fourth embodiment consists of two transistors.

In the embodiment of FIG. 34E (FIG. 34D), the gates of the transistors QP11, QP12, QN11, and QN12 (QP1 and QN1) are connected to one another, and the gates of the transistors QP21, QP22, QN21, and QN22 (QP2 and QN2) are connected to one another. If the eight (four) diodes of the transistors are connected in series without connecting the gates to one another, the diodes cause a large voltage drop of, for example 5.6 (2.8)V, so that the circuit may not sufficiently serve as a reference voltage generator when the source voltage Vcc is 3.3V. If the gates are connected to one another, the voltage drop is suppressed to that of two diodes, for example, 1.4V. When a voltage to be used is high, the gates of the transistors may not be connected to one another.

In the first to fifth embodiments of FIGS. 34A to 34E, the number of the p-channel MOS transistors QP1 and QP2, or QP11, QP12, QP21, and QP22 is the same as the number of the n-channel MOS transistors QN1 and QN2, or QN11, QN12, QN21, and QN22. The arrangement of the transistors between the high potential power source Vcc and the node N1 is the same as the arrangement of the transistors between the node N1 and the low potential power source Vss. There are four p- and n-channel MOS transistors QP1, QP2, QN1, and QN2 in total, or there are eight p- and n-channel MOS transistors QP11, QP12, QP21, QP22, QN11, QN12, QN21, and QN22 in total.

The number of the transistors may be 4 by n (n being a natural number) according to the present invention. The threshold voltage of any one of the p-channel MOS transistors QP1 and QP2, or QP11, QP12, QP21, and QP22 may be the same as that of any one of the n-channel MOS transistors QN1 and QN2, or QN11, QN12, QN21, and QN22. Alternatively, the difference between the threshold voltage of any one of the p-channel MOS transistors and the threshold voltage of any one of the n-channel MOS transistors may be equal to or smaller than 10% of a source voltage. These modifications are applicable to sixth to 15th embodiments of the second aspect of the present invention mentioned below.

Any one of the first to 15th embodiments of the second aspect of the present invention generates a reference voltage Vref with the use of p- and n-channel MOS transistors symmetrically arranged between a high potential power source Vcc and a low potential power source Vss. Accordingly, any one of the embodiments is capable of stabilizing the reference output voltage Vref in a pull-up state in which a current flows to the semiconductor circuit (reference voltage generator) as well as in a pull-down state in which a current flows out of the circuit. Each of the embodiments employs no resistors that always consume a direct current, so that the embodiments are low power consumption and provide a low output impedance.

FIGS. 35A to 35D show semiconductor circuits according to the sixth to ninth embodiments of the second aspect of the present invention.

Figure 35A:
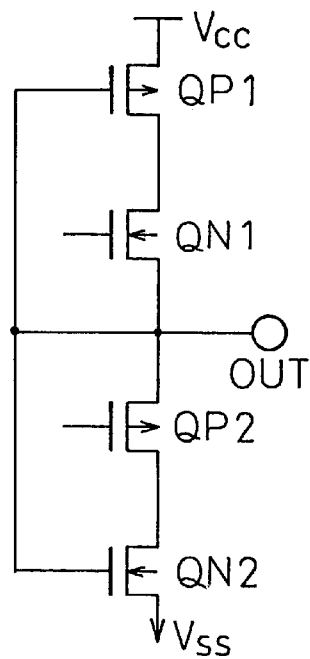
FIGS. 35A to 35D are diagrams showing semiconductor circuits according to embodiments of the present invention (part 2)

In the sixth embodiment of FIG. 35A, the gate of a transistor QP1 connected to a high potential power source Vcc and the gate of a transistor QN2 connected to a low potential power source Vss are connected to a node OUT between the source of a transistor QN1 and the source of a transistor QP2. Namely, the output OUT is connected to the gates of the outer transistors QP1 and QN2 among the transistors connected in series between the high potential power source Vcc and the low potential power source Vss.

Figure 35B:
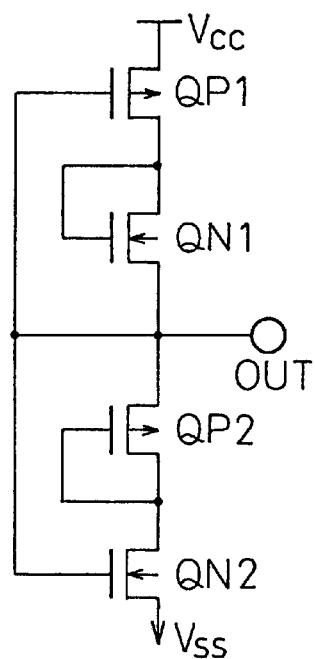

The seventh embodiment of FIG. 35B involves transistors QN1 and QP2 that are connected to form diodes similar to the second embodiment of FIG. 34B. An output OUT is connected to the gates of transistors QP1 and QN2, the gate and drain of the transistor QN1 are connected to each other, and the source and gate of the transistor QP2 are connected to each other.

Figure 35C:
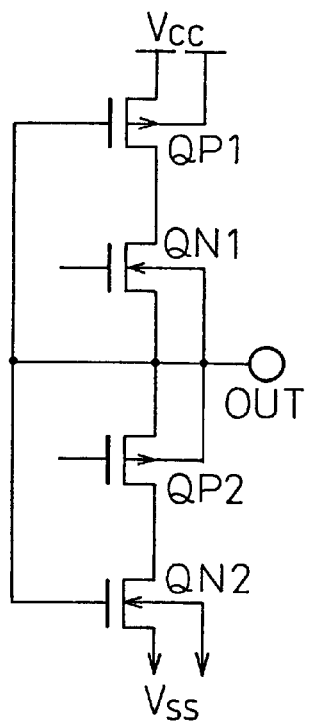

According to the eighth embodiment of FIG. 35C, an output OUT serves as the substrate bias potential (well bias potential) of transistors QN1 and QP2. The output OUT is connected to the gates of transistors QP1 and QN2 and to the back gates of the transistors QN1 and QP2.

Figure 35D:
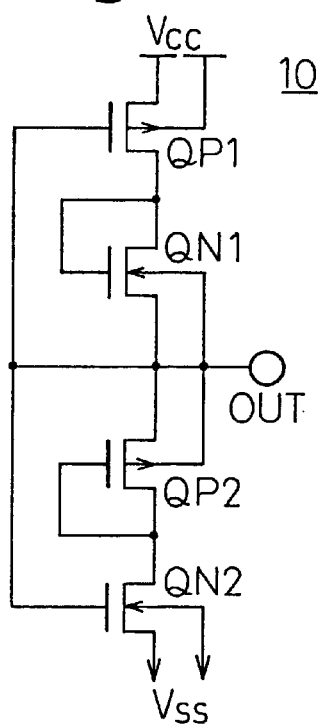

The ninth embodiment of FIG. 35D id a combination of the embodiments of FIGS. 35B and 35C. Transistors QN1 and QP2 are connected to form diodes, and an output OUT is connected to the gates of transistors QP1 and QN2 and to the back gates of the transistor QN1 and QP2. According to the eighth and ninth embodiments of FIGS. 35C and 35D, a high potential power source Vcc is connected to the back gate (substrate or well) of the transistor QP1, and a low potential power source Vss is connected to the back gate of the transistor QN2.

The semiconductor circuits of the embodiments of FIGS. 35C and 35D employ a triple well structure.

Figure 36A:
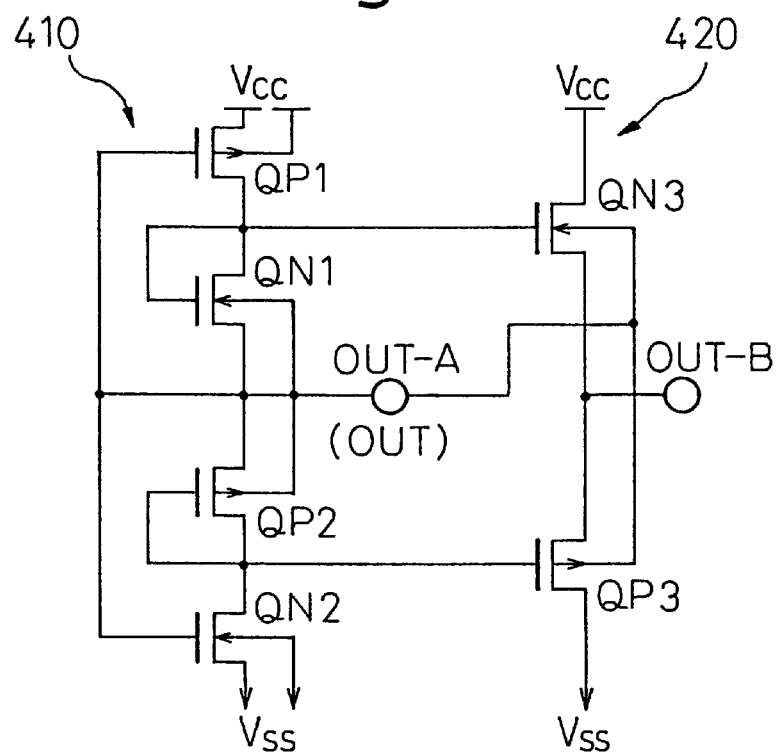
FIGS. 36A and 36B are diagrams showing semiconductor circuits according to embodiments of the present invention (part 3)
Figure 36B:
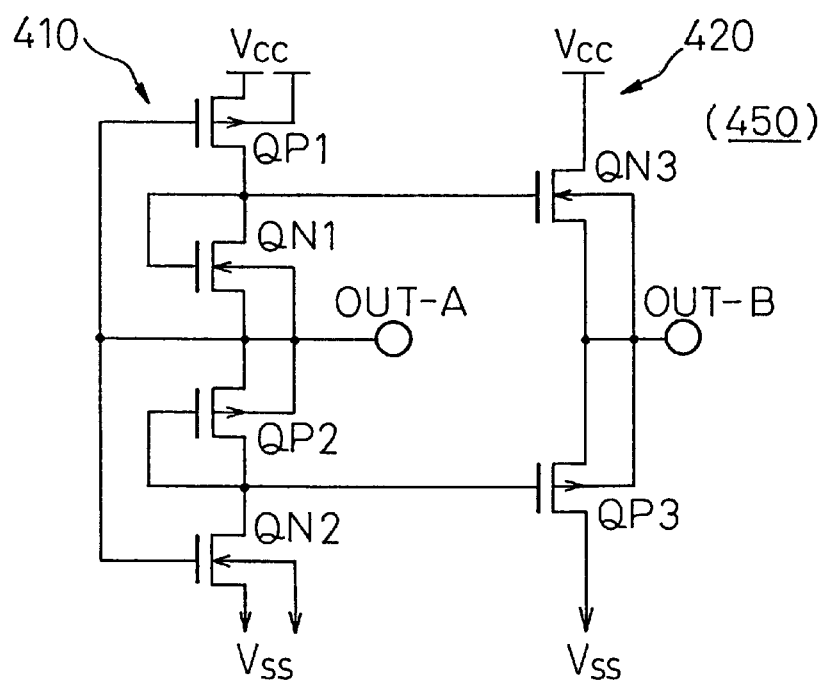

FIGS. 36A and 36B show semiconductor circuits according to the 10th and 11th embodiments of the present invention. In these figures, reference numeral 410 is a first output section and 420 is a second output section.

The 10th embodiment of FIG. 36A arranges a second output section 420 in parallel with a first output section 410, which corresponds to the circuit of the ninth embodiment of FIG. 35D. The second output section 420 provides a second output OUT-B. The second output section 420 consists of an n-channel MOS transistor QN3 and a p-channel MOS transistor QP3 that are connected in series between a high potential power source Vcc and a low potential power source Vss. The drain of the transistor QN3 is connected to the high potential power source Vcc, and the source thereof is connected to the source of the transistor QP3 and to the second output OUT-B. The drain of the transistor QP3 is connected to the low potential power source Vss.

The first output section 410 is identical to the circuit of the ninth embodiment of FIG. 35D. The first output OUT-A of the first output section 410 is connected to the back gates (substrates or wells) of the transistors QN3 and QP3 of the second output section 420. The gate of the transistor QN3 is connected to a node between the drain of a transistor QP1 and the gate and drain of a transistor QN1. The gate of the transistor QP3 is connected to a node between the drain of a transistor QN2 and the gate and drain of a transistor QP2.

Similar to the 10th embodiment, the 11th embodiment of FIG. 36B arranges a second output section 420 for providing a second output OUT-B in parallel with a first output section 410, which corresponds to the circuit of the ninth embodiment of FIG. 35D. The back gates of transistors QN3 and QP3 are connected to the second output OUT-B, instead of a first output OUT-A in the case of the 10th embodiment of FIG. 36A. Namely, the second output OUT-B is connected to the source and back gate of the transistor QN3 and to the source and back gate of the transistor QP3.

Figure 37A:
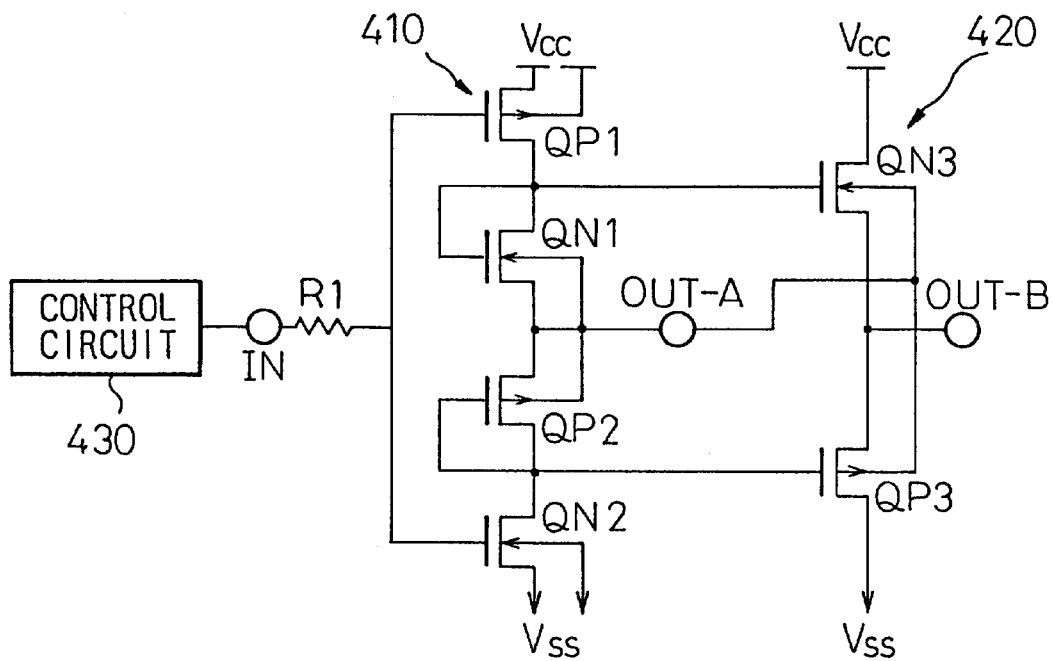
FIGS. 37A and 37B are diagrams showing control circuits for controlling the semiconductor circuits of FIGS. 36A and 36B.
Figure 37B:
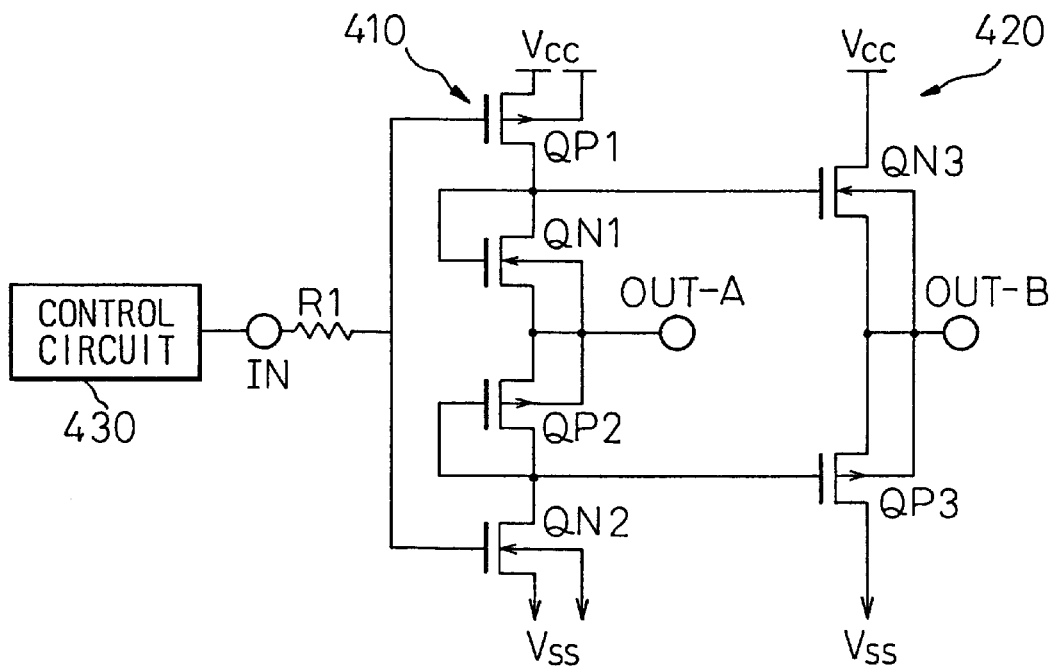

FIG. 37A shows a control circuit for controlling the semiconductor circuit of FIG. 36A, and FIG. 37B shows a control circuit for controlling the semiconductor circuit of FIG. 36B. In FIG. 37A, the gates of the transistors QP1 and QN2 are separated from the first output OUT-A and are connected to the output of the control circuit 30 through a resistor R1. In FIG. 37B, the gates of the transistors QP1 and QN2 are separated from the first output OUT-A and are connected to the output of the control circuit 430 through a resistor R1. Each of the control circuits 430 accurately adjusts the outputs OUT-A and OUT-B.

Figure 38:
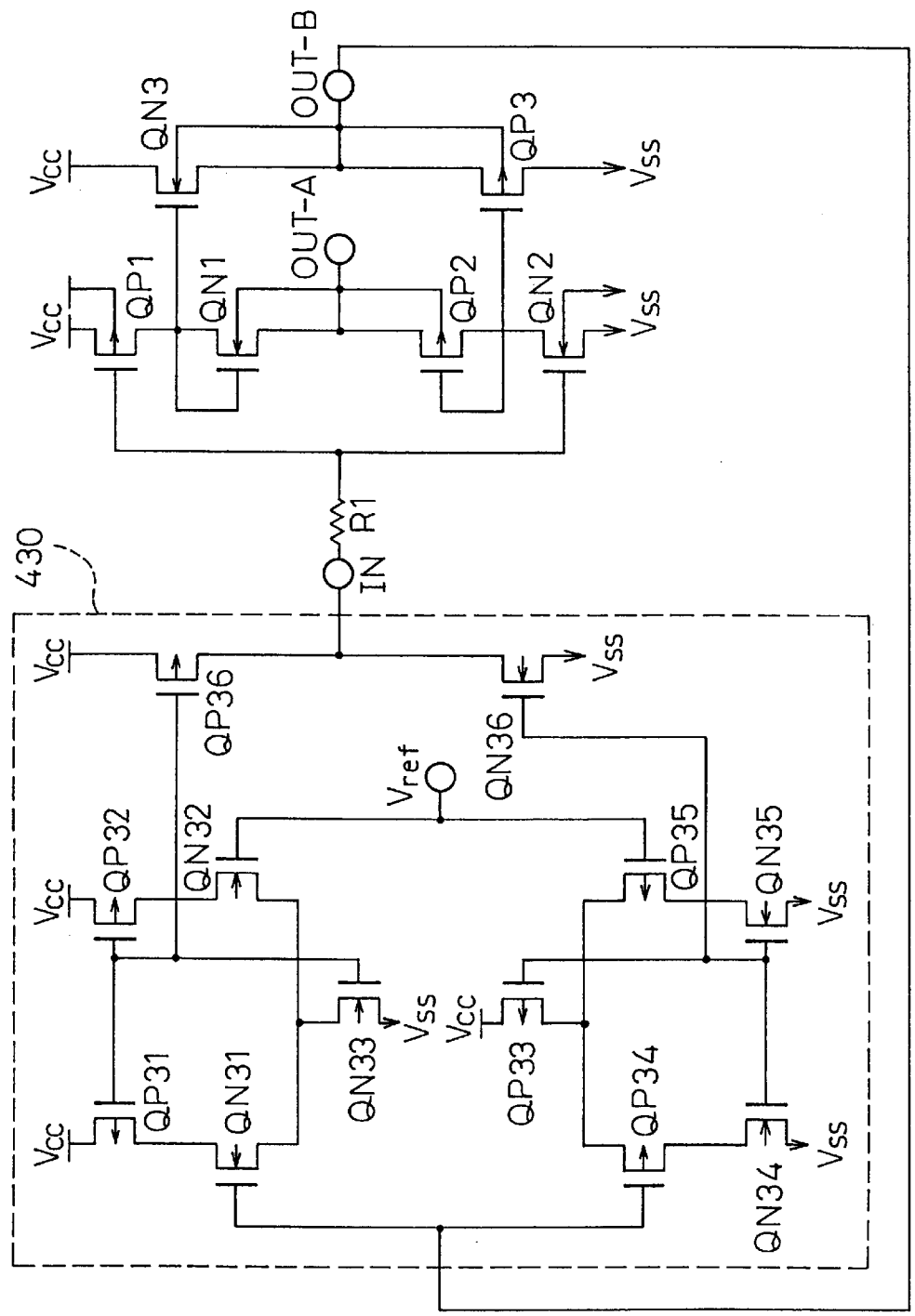
FIG. 38 is a diagram showing a circuit diagram employing the semiconductor circuit of FIG. 36B.

FIG. 38 shows the details of the semiconductor circuit and control circuit of FIG. 37B.

In FIG. 38, the control circuit 430 consists of p-channel MOS transistors QP31 to QP36 and n-channel MOS transistors QN31 and QN36. A reference voltage Vref is applied to the gates of the transistors QN32 and QP35.

Figure 39:
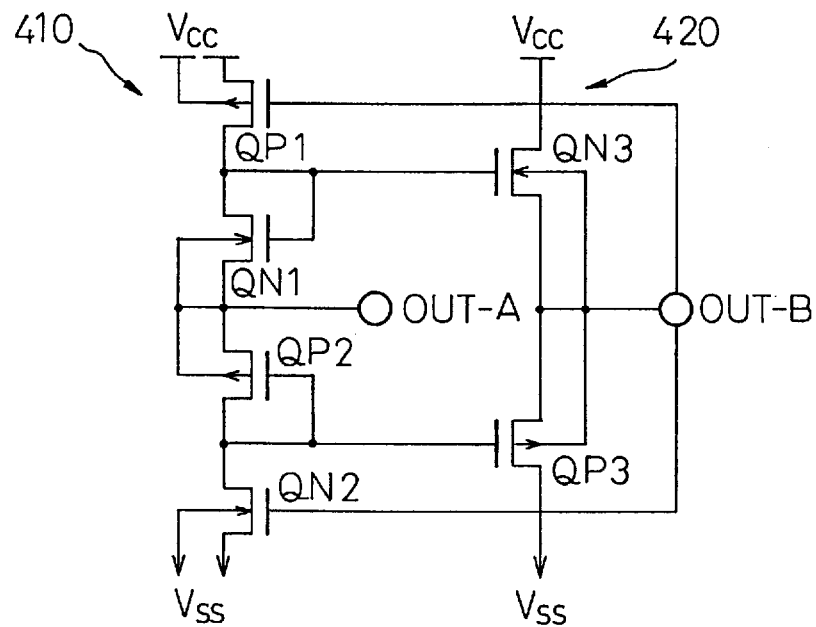
FIG. 39 is a diagram showing a semiconductor circuit according to an embodiment of the present invention (part 4)

FIG. 39 shows a semiconductor circuit according to the 12th embodiment of the present invention. This embodiment connects the gates of transistors QP1 and QN2 to the second output OUT-B of a second output section 420, instead of the first output OUT-A of a first output section in the case of the 11th embodiment of FIG. 36B.

Figure 40:
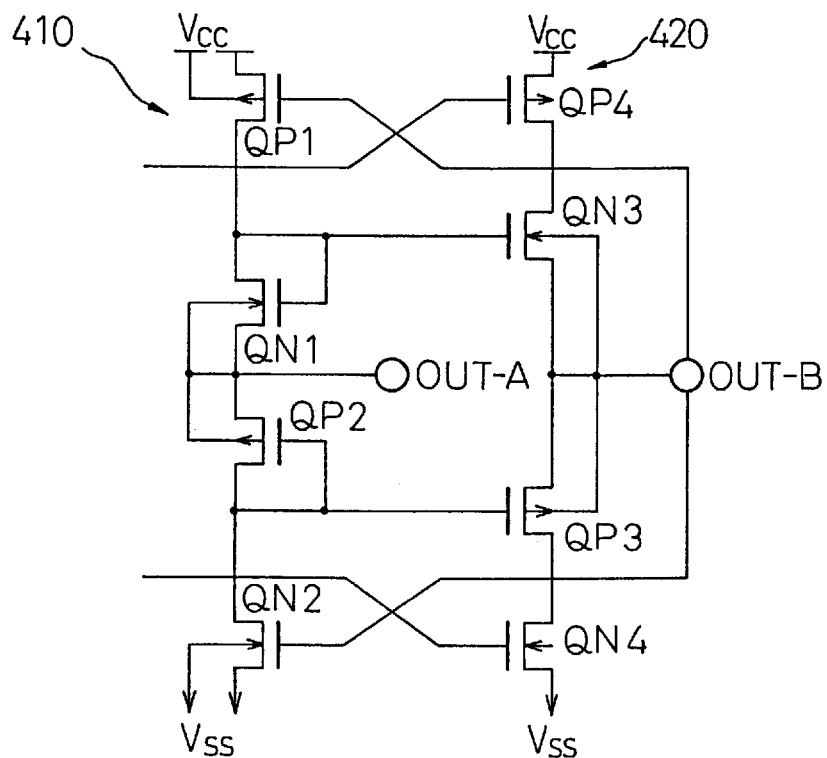
FIG. 40 is a diagram showing a semiconductor circuit according to an embodiment of the present invention (part 5);.

FIG. 40 shows a semiconductor circuit according to the 13th embodiment of the present invention. This embodiment forms a second output section 420 with four transistors similar to a first output section 410. Namely, the second output section 420 consists of two p-channel MOS transistors QP3 and QP4 and two n-channel MOS transistors QN3 and QN4 connected in series between a high potential power source Vcc and a low potential power source Vss. The source of the transistor QP4 is connected to the high potential power source Vcc, and the drain thereof is connected to the drain of the transistor QN3. The source and back gate (substrate or well) of the transistor QN3 are connected to the source and back gate of the transistor QP3 and to the second output OUT-B of the second output section 420. The drain of the transistor QP3 is connected to the drain of the transistor QN4. The source of the transistor QN4 is connected to the low potential power source Vss. The gates of transistors QP1 and QN2 of the first output section 410 are connected to the second output OUT-B. The gate of the transistor QN3 is connected to the gate of the transistor QN1, and the gate of the transistor QP3 s connected to the gate of the transistor QP2.

Figure 41:
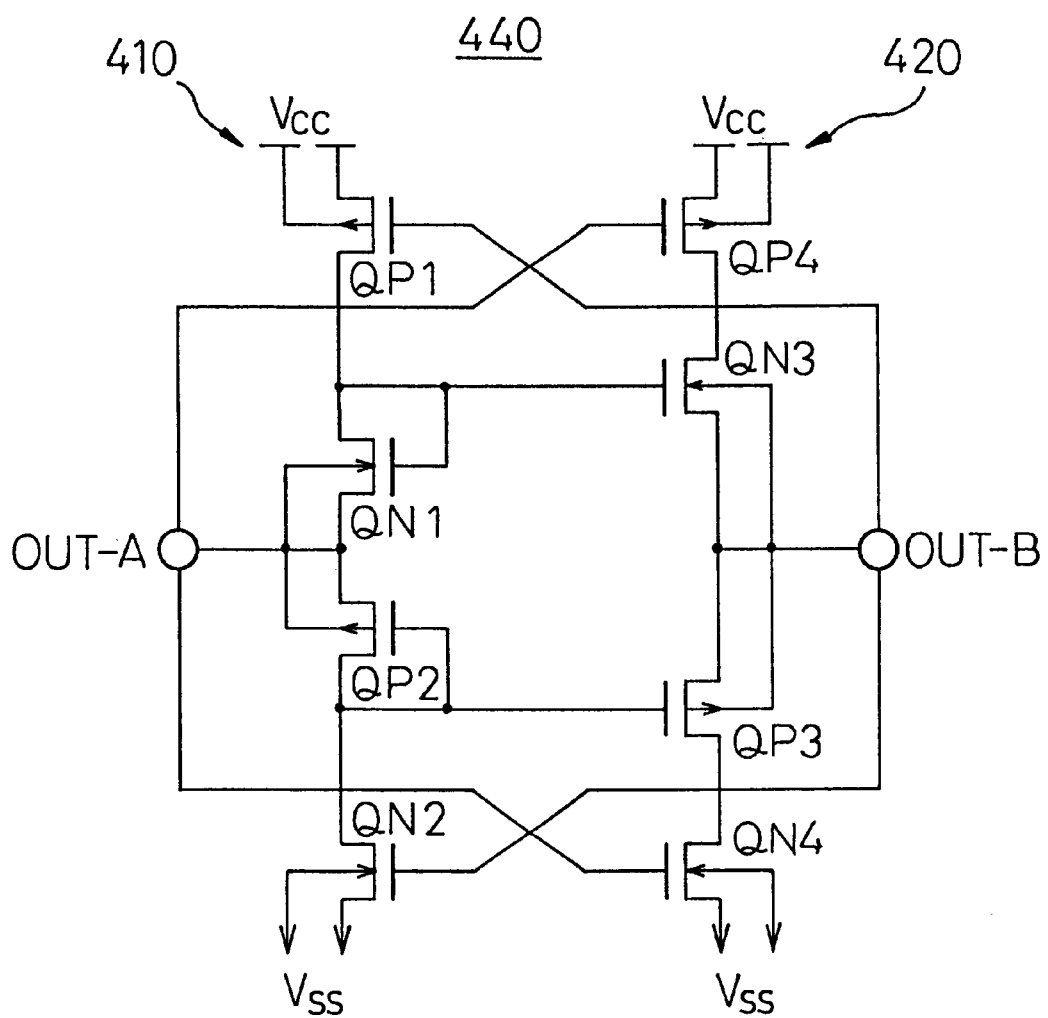
FIG. 41 is a diagram showing a semiconductor circuit according to an embodiment of the present invention (part 6)

FIG. 41 shows a semiconductor circuit 440 according to the 14th embodiment of the present invention. The back gate of a transistor QP4 is connected to a high potential power source Vcc, the back gate of a transistor QN4 is connected to a low potential power source Vss, and the gates of the transistors QP4 and QN4 of a second output section 420 are connected to a first output OUT-A. Namely, the arrangement of the second output section 420 is the same as that of the first output section 410.

Figure 42:
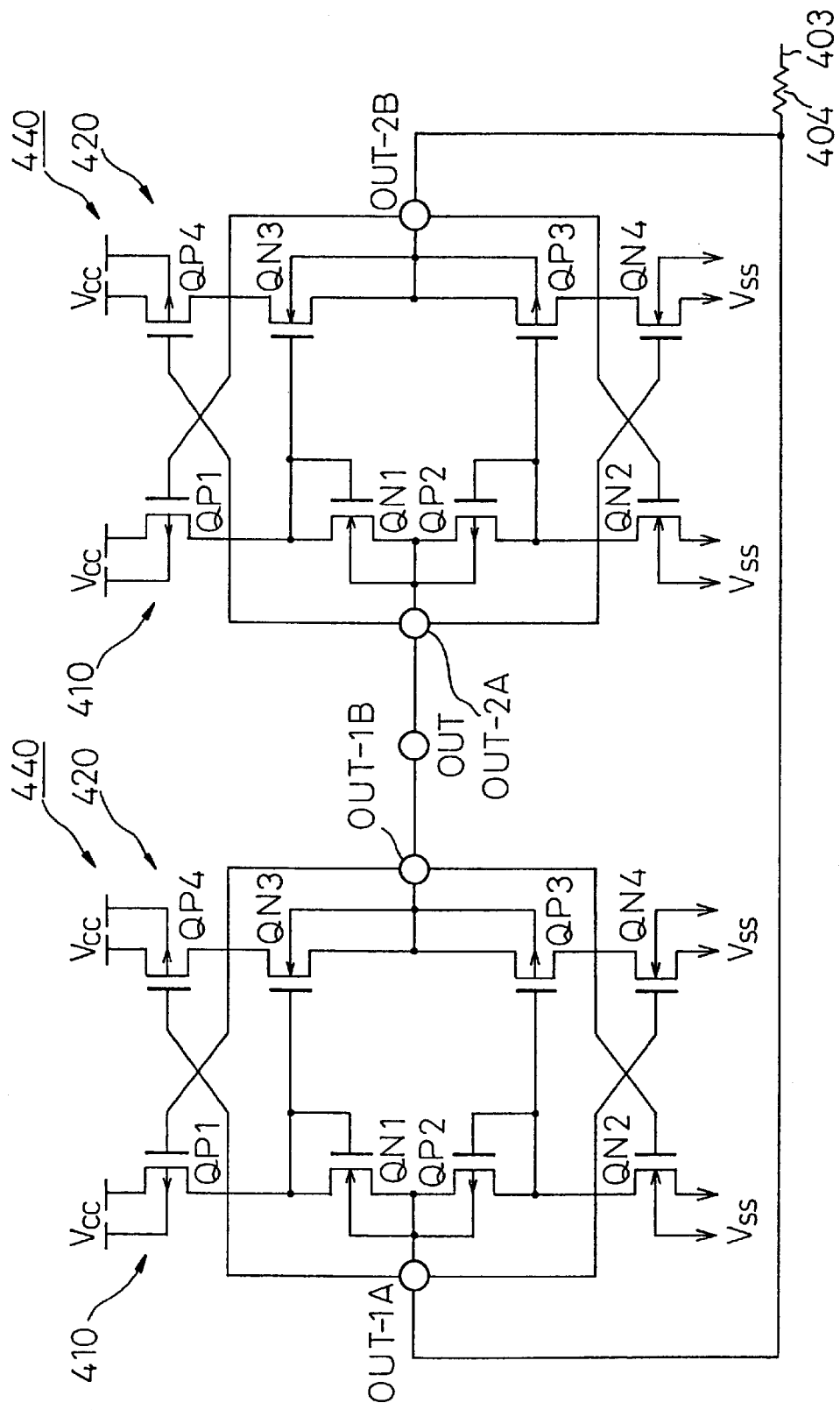
FIG. 42 is a diagram showing a semiconductor circuit according to an embodiment of the present invention (part 7)

FIG. 42 shows a semiconductor circuit according to the 15th embodiment of the present invention. This embodiment employs two semiconductor circuits 440 each corresponding to the semiconductor circuit of the 14th embodiment of FIG. 41. The second output OUT-1B of the first semiconductor circuit is connected to the first output OUT-2A of the second semiconductor circuit, to provide an output OUT. The second output OUT-2B of the second semiconductor circuit is connected to the first output OUT-1A of the first semiconductor circuit. The second output OUT-2B is also connected to a data bus 403 through a terminating resistor 404.

Figure 43:
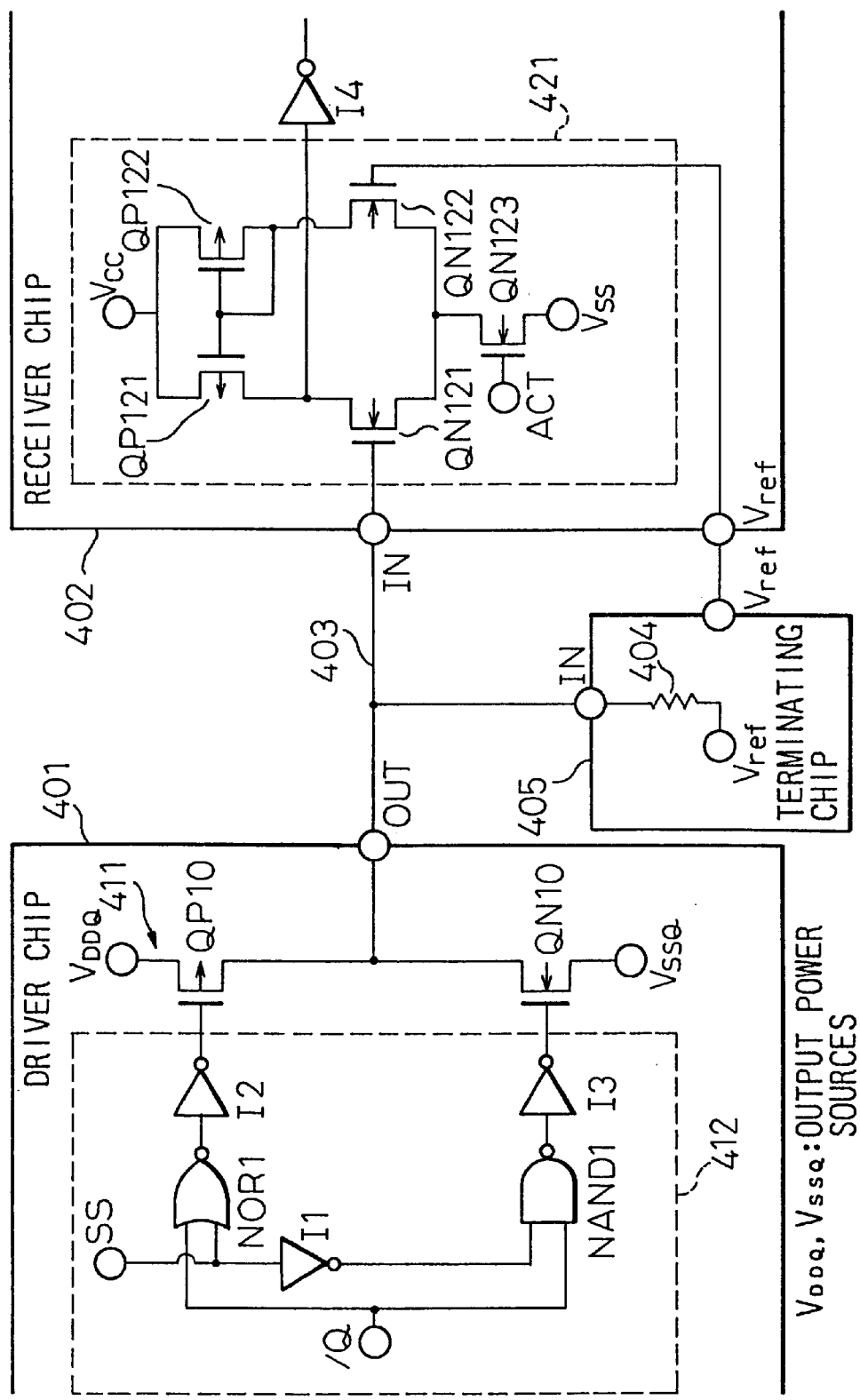
FIG. 43 is a diagram showing a bus and chips employing a semiconductor circuit according to the present invention.

FIG. 43 is a block diagram showing a semiconductor device according to the present invention, a bus, and a terminal power source of a small-amplitude I/O device. The figure shows a driver chip 401, a receiver chip 402, a data bus 403, a terminating resistor (RTT) 404, a terminating chip 405 incorporating a semiconductor circuit of the present invention, a push-pull circuit 411, and an output buffer 412. The elements 411 and 412 are included in the driver chip 401.

In FIG. 43, data is supplied from the driver chip 401 to the receiver chip 402 through the data bus 403. The data bus 403 is driven by the push-pull circuit 411. The push-pull circuit 411 has a p-channel MOS transistor QP10 and an n-channel MOS transistor QN10 and is controlled by the output buffer 412. Output power sources VDDQ and VSSQ are applied to the push-pull circuit 411.

The output buffer 412 on the driver chip 401 consists of inverters I1 to I3, a NOR gate NOR1, and a NAND gate NAND1. The outputs of the inverters I2 and I3 control the transistors QP10 and QN10, respectively. The NOR gate NOR1 receives an inverted output signal/Q from a flip-flop circuit and a control signal SS. The NAND gate NAND1 receives the inverted output signal/Q and an inversion of the control signal SS. When the control signal SS is at high level H, the transistors QP10 and QN10 are turned OFF to put the output OUT of the driver chip 1 in a high impedance state.

The receiver chip 402 has an input terminal IN, which is connected to an input buffer 421. The input buffer 421 amplifies the difference between an input signal and a reference voltage Vref. An output from the input buffer (differential amplifier) 412 is supplied to another circuit through an inverter I4. The input buffer 421 consists of p-channel MOS transistors QP121 and QP122 and n-channel MOS transistors QN121, QN122, and QN123. The gate of the transistor QN123 receives an active signal ACT to control the operation of the input buffer 421.

Figure 44:
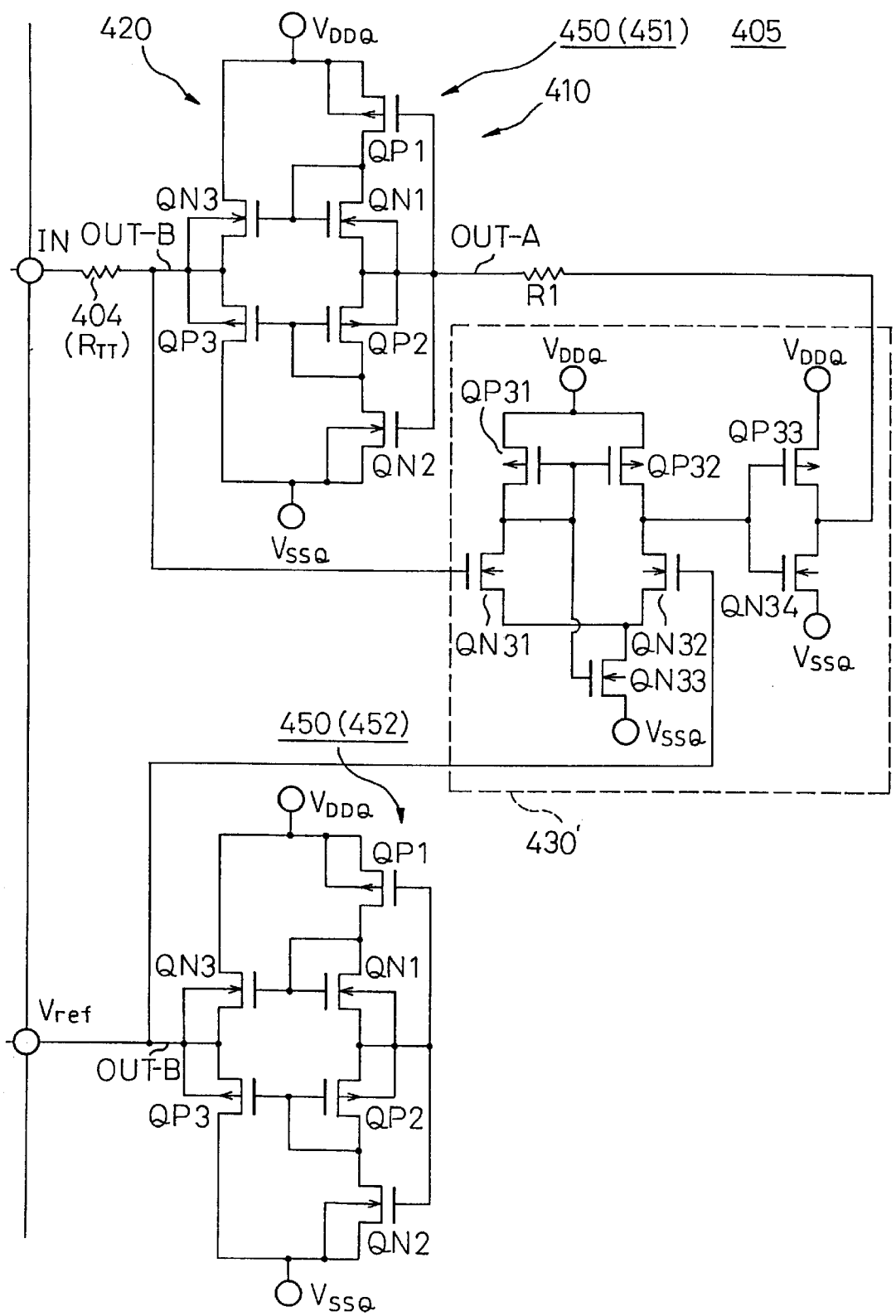
FIG. 44 is a diagram showing a terminating chip of FIG. 43 employing a semiconductor circuit according to the present invention.

FIG. 44 shows the details of the terminating chip of FIG. 43 incorporating the semiconductor circuit of the present invention.

The terminating chip 450 of FIG. 44 has the terminating resistor (RTT) 404, two semiconductor circuits (reference voltage generators) 451 and 452 (450), and a control circuit 430'. Each of the reference voltage generators 451 and 452 corresponds to the semiconductor circuit 450 of the 11th embodiment of FIG. 36B. Similar to the driver chip 401, the terminating chip 405 is connected to power sources VDDQ and VSSQ (0V).

The reference voltage generator 451 is connected to the data bus 403 through the terminating resistor 404, to apply a reference voltage Vref to the data bus 403. The reference voltage generator 452 supplies a reference voltage Vref to a differential amplifier of the control circuit 430' and to the differential amplifier (input buffer) 421 of the receiver chip 402 of FIG. 43. The reference voltage Vref may be an intermediate potential, i.e., ½ of VDDQ between the power sources VDDQ and VSSQ.

The control circuit 430' consists of an input buffer (a differential amplifier) and an inverter. The input buffer consists of p-channel MOS transistors QP31 and QP32 and n-channel MOS transistors QN31, QN32, and QN33. The inverter consists of a p-channel MOS transistor QP33 and an n-channel MOS transistor QN34. The input buffer of the control circuit 430' is connected to the data bus 403 through the terminating resistor 404. Namely, the input buffer of the control circuit 430' receives the second output OUT-B of the reference voltage generator 451, and amplifies the difference between the second output OUT-B and the reference voltage Vref provided by the reference voltage generator 452. The output of the inverter of the control circuit 430' is supplied to the first output OUT-A of the reference voltage generator 451 through a resistor R1. This arrangement maintains the level of the data bus 403 at the reference voltage Vref when no data is transferred.

Figure 45:
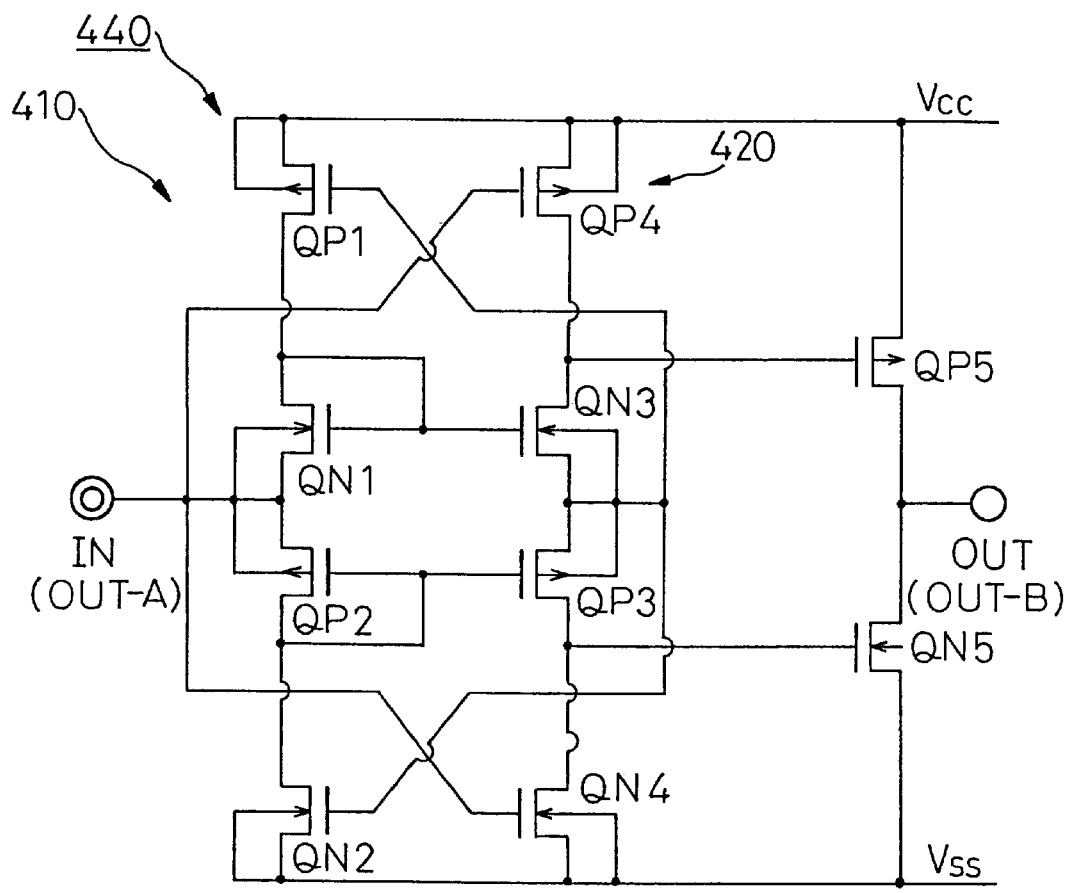
FIG. 45 is a diagram showing an input buffer employing a semiconductor circuit according to the present invention.

FIG. 45 is a circuit diagram showing an input buffer employing the semiconductor circuit of the 14th embodiment of the present invention of FIG. 41.

As is apparent in FIGS. 41 and 45, an input terminal IN of this input buffer if the first output OUT-A of the 14th embodiment, and provides an output OUT from a node between a p-channel MOS transistor QP5 and an n-channel MOS transistor QN5. The gate of the transistor QP5 is connected to a node between transistor QP4 and QN3, and the gate of the transistor QN5 is connected to a node between transistor QP3 and QN4.

As explained above, the semiconductor circuit according to the present invention is applicable not only as a reference voltage generator or a cell plate power source of a DRAM but also as an input buffer as shown in FIG. 45 and a logic gate having a threshold.

In this way, the semiconductor circuit according to any one of the embodiments of the present invention employs p- and n-channel MOS transistors that are symmetrically arranged between a high potential power source Vcc and a low potential power source Vss, to stabilize an output (a reference voltage Vref) both when a current flows into the semiconductor circuit and when a current flows out of the semiconductor circuit.

As explained above in detail, a semiconductor circuit according to the present invention (second aspect of the present invention) provides a small output impedance at low direct current consumption.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor circuit, comprising:

a first power source means;

a second power source means;

a plurality of first-conductivity transistors;

a plurality of second-conductivity transistors, said plurality of first-conductivity transistors and said plurality of second-conductivity transistors forming a first output section; and a first output node for providing a first output, wherein at least one of said first-conductivity transistors and at least one of said second-conductivity transistors form a first group of transistors with their source-drain circuits connected in series between said first power source means and said first output node and at least another one of said first-conductivity transistors and at least another one of said second-conductivity transistors form a second group oftransistors with their source-drain circuits connected in series between said first output node and said second power source means, wherein the first output serves as the substrate or well potential of the transistors other than the transistors that are directly connected to the first and second power source means, respectively, wherein said semiconductor circuit further comprises at least one additional second-conductivity transistor and at least one additional first-conductivity transistor, these additional transistors being connected with their source-drain circuits in series between said first power source means and said second power source means and forming a second output section that provides a second output, which is different from said first output, wherein said first output serves as a substrate or well potential of said transistors of said second output section to provide said second output.

2. A semiconductor circuit as claimed in claim 1, wherein an output from a control circuit is applied to a control electrode of said first-conductivity transistor connected to said first power source means in said first output section and to a control electrode of said second-conductivity transistor connected to said second power source means in said first output section, to accurately adjust said first output.

3. A semiconductor circuit as claimed in claim 2, wherein said semiconductor circuit further comprises a resistor arranged between said control circuit and the control electrodes of said transistors of said first output section.

4. A semiconductor circuit as claimed in claim 3, wherein said control circuit detects a difference between said first output and a reference voltage.

* * * * *

UNITED STATES PATENT AND TRADEMARK OFFICE
CERTIFICATE OF CORRECTION

PATENT NO.    : 6,384,671 B1
DATED         : May 7, 2002
INVENTOR(S)   : Yoshinori Okajima It is certified that error appears in the above-identified patent and that said Letters Patent is hereby corrected as shown below:

<u>Title page,</u>
Item [12], "Taguchi et al." should read -- Yoshinori Okajima --
Item [75], "Masao Taguchi; Satoshi Eto; Yoshinori Okajima, all of Kawasaki (JP)" should be -- Yoshinori Okajima, Kawasaki (JP) --

Signed and Sealed this

Fourteenth Day of January, 2003

JAMES E. ROGAN
*Director of the United States Patent and Trademark Office*